United States Patent
Sugimae et al.

(10) Patent No.: US 7,847,363 B2
(45) Date of Patent: Dec. 7, 2010

(54) SEMICONDUCTOR MEMORY

(75) Inventors: Kikuko Sugimae, Yokohama (JP); Satoshi Tanaka, Kawasaki (JP); Koji Hashimoto, Yokohama (JP); Masayuki Ichige, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/370,638

(22) Filed: Feb. 13, 2009

(65) Prior Publication Data

US 2009/0154214 A1 Jun. 18, 2009

Related U.S. Application Data

(62) Division of application No. 11/125,274, filed on May 10, 2005, now Pat. No. 7,528,452.

(30) Foreign Application Priority Data

Oct. 7, 2004 (JP) .............................. 2004-295268

(51) Int. Cl.
*G11C 5/00* (2006.01)
(52) U.S. Cl. ............... 257/443; 257/390; 257/E21.657; 257/E27.084
(58) Field of Classification Search .................. 257/390, 257/443, E21.657, E21.658, E27.084
See application file for complete search history.

(56) References Cited

U.S. PATENT DOCUMENTS 6,930,324 B2    8/2005   Kowalski et al.
2001/0038110 A1 11/2001  Clampitt et al.
2003/0202404 A1 10/2003  Scheuerlein
2005/0077562 A1  4/2005  Divakaruni et al.
2005/0169040 A1  8/2005  Peng et al.
2005/0281098 A1 12/2005  Sadra et al.

FOREIGN PATENT DOCUMENTS

| JP | 03-088200   | 4/1991 |
| JP | 9-97882     | 4/1997 |
| JP | 10-242147   | 9/1998 |
| JP | 2002-151604 | 5/2002 |
| JP | 2004-015056 | 1/2004 |

*Primary Examiner*—Fernando L Toledo
(74) *Attorney, Agent, or Firm*—Oblon, Spivak, McClelland, Maier & Neustadt, L.L.P.

(57) ABSTRACT

Borderless contacts for word lines or via contacts for bit lines are formed using interconnect patterns, a part of which is removed. A semiconductor memory includes: a plurality of active regions $AA_i$, $AA_{i+1}$, . . . , $AA_n$, which extend on a memory cell array along the column length; a plurality of word line patterns WL1, WL2, . . . , extend along the row length and are non-uniformly arranged; a plurality of select gate line patterns SG1, SG2, . . . , are arranged parallel to the plurality of word line patterns; borderless contacts are formed near the ends of the word line patterns on the memory cell array, and are in contact with part of an interconnect extended from the end of the memory cell array, but are not in contact with interconnects adjacent to that interconnect; and bit line contacts are formed within contact forming regions provided by removing part of the plurality of word line patterns and select gate line patterns through double exposure.

1 Claim, 36 Drawing Sheets

US 7,847,363 B2

SEMICONDUCTOR MEMORY

CROSS REFERENCE TO RELATED APPLICATIONS

This application is a division of and claims the benefit of priority under 35 U.S.C. §120 from U.S. Ser. No. 11/125,274 filed May 10, 2005, and claims the benefit of priority under 35 U.S.C. §119 from Japanese Patent Application P2004-295268 filed Oct. 7, 2004, the entire contents of each of which are incorporated by reference herein.

BACKGROUND OF THE INVENTION

1. Field of the Invention

The present invention relates to interconnect layers and contacts in a semiconductor. More specifically, it relates to a semiconductor memory including an extended region, extended from a cell array, in which interconnects are formed at a fine pitch. A control gate, a metallic interconnect, a bit line pattern, or related patterns are formed with non-uniform patterns in such extended region.

2. Description of the Related Art

Diagonal interconnects are conventionally used in extended regions of a semiconductor memory. More specifically, diagonal interconnects are used to provide a longer pitch in a region extending to contacts. However, as miniaturization advances, cells are being miniaturized by forming patterns with high resolution in only a single direction through double exposure. This brings about needs to form all cell patterns with lines and spaces at regular intervals. Therefore, it is impossible to form a non-uniform pattern in the extended region. This problem brings about needs to form contacts within such a pattern of lines and spaces not including such contact formation patterns.

Japanese Patent Application Laid-open No. Hei 9-97882 (FIGS. 37 and 39) discloses a semiconductor device and a fabrication method thereof for forming contacts with diffusion layers by use of self-aligned polysilicon and polysilicon plugs formed in an array-shaped active region of a DRAM after formation of device isolating regions, rather than forming contacts with gate interconnect patterns or the like.

SUMMARY OF THE INVENTION

An aspect of the present invention inheres in A semiconductor memory which includes: a plurality of bit lines that extend on a memory cell array along a column length of the memory cell array; a plurality of word lines that extend along a row length of the memory cell array; and a plurality of word line contacts formed at the ends of the word lines, respectively. The word lines are linearly formed, and lengths of at least two adjacent word lines along the row length differ from each other.

Another aspect of the present invention inheres in a semiconductor memory which includes: a plurality of bit lines that extend on a memory cell array along the column length of the memory cell array; a plurality of word lines orthogonal to the bit lines and extending along the row length of the memory cell array; and via contacts that are linearly arranged on the bit lines along the row length sandwiching a defective pattern region of the bit lines at ends of the bit lines. The bit lines have a stripe-shaped non-uniform pattern running along the column length.

Another aspect of the present invention inheres in a semiconductor memory which includes: a plurality of bit lines that extend on a memory cell array along the column length of the memory cell array; a plurality of word lines that extend along the row length of the memory cell array; and a plurality of via contacts formed at respective ends of the bit lines. The bit lines are linearly formed, and the lengths of at least two adjacent bit lines along the column length differ from each other.

BRIEF DESCRIPTION OF DRAWINGS

FIG. 22A is cross-sectional device structures of a borderless contact (CG) 14 and a select gate contact (SG) 15a;

FIG. 22B is cross-sectional device structures of a bit line contact (CB) 11 and a source line contact (CS) 12;

DETAILED DESCRIPTION OF THE INVENTION

Figure 1:
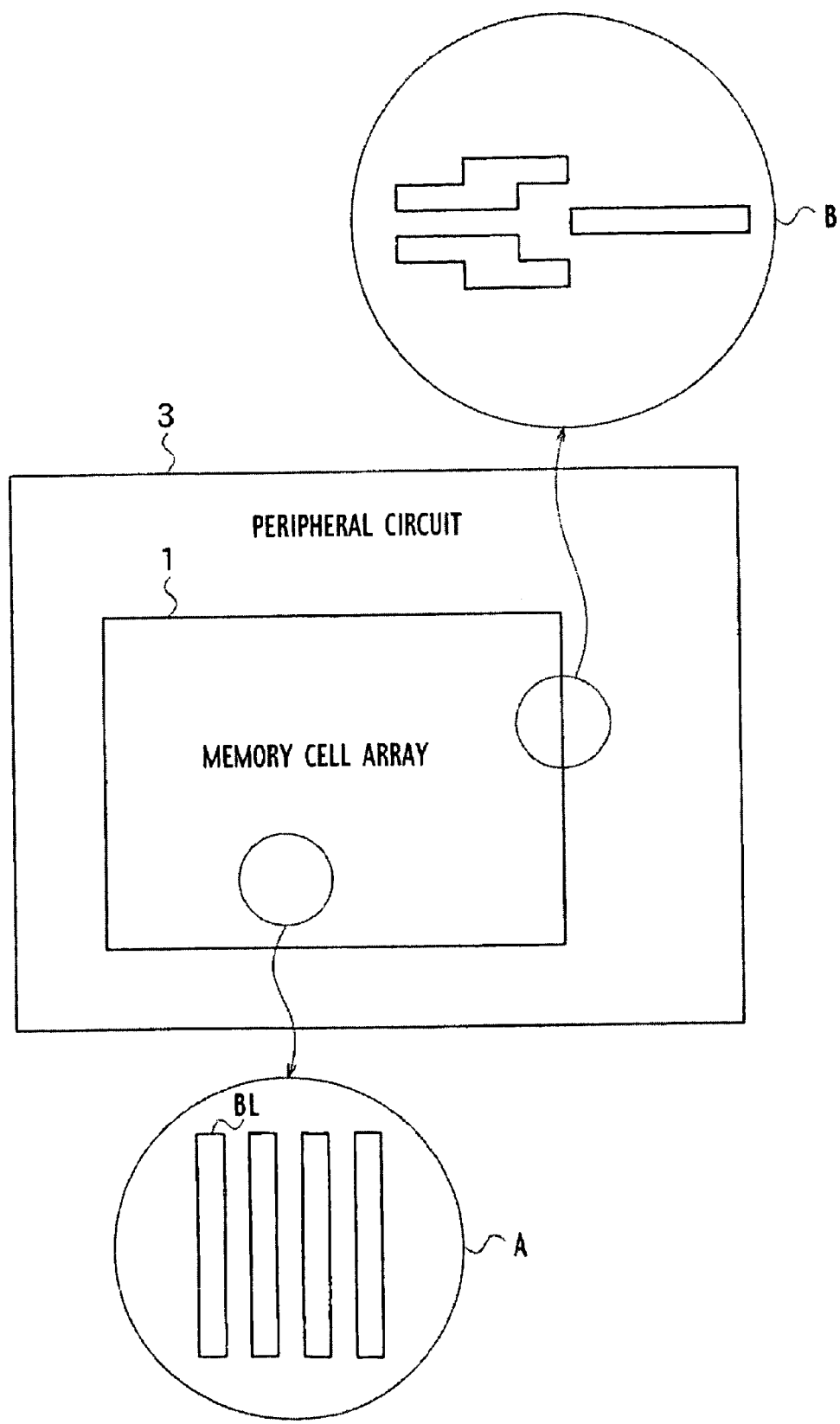
FIG. 1 is a schematic plan view of a semiconductor memory according to a reference example of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order to not obscure the present invention with unnecessary detail.

Referring to the drawings, embodiments of the present invention are described below. The same or similar reference numerals are attached to identical or similar parts among the following drawings. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

A contact formation method for interconnects deployed at a cell rule-based pitch, according to the present invention, provides a semiconductor memory such that contact connecting regions are formed through a second exposure; contacts are formed in those contact connecting regions, and constitute borderless contacts (word line contacts), which cover part of the interconnects. Those interconnects are then connected with those borderless contacts to provide an improved yield.

In other words, a semiconductor memory fabricated by forming bit line contacts CB, source line contacts CS, borderless contacts for word lines or select gate lines (word line contacts and select gate contacts), via contacts for bit line extended regions, and via contacts for bit lines is possible. This method provides an improved yield According to a contact formation method for interconnects deployed at a cell rule-based pitch, which is used for forming contacts in extended regions from a cell array interconnected at a fine pitch, contact connecting regions are formed through a second exposure, and contacts are then formed in those contact connecting regions. Those contacts are borderless contacts, which cover a part of interconnects and allow connection of interconnects so as to provide an improved yield.

In the description of the embodiments of the present invention, 'M0' denotes a metallic layer at the same hierarchical level as a bit line extended region 19, a select gate line extended region 20, and a tungsten electrode film 50. Similarly, 'M1' denotes a metallic layer at the same hierarchical level as a copper (Cu) electrode film 60. 'V1' denotes a via contact 46. Via contacts 10 (V1-M1) are used for connecting the V1 and the M1 level. Via contacts 13 (M0-V1) are used for connecting the M0 and the V1 level.

The first through the eleventh embodiments of the present invention are described forthwith while referencing the drawings. The same or similar symbols are given to the same or similar parts throughout the appended drawings. However, it should be noted that the drawings are merely schematics such that the relationship between thickness and planar dimension, and the ratio of respective layer thicknesses and the like differ from those of the actual invention. Accordingly, specific thicknesses and dimensions should be determined considering the following description. Furthermore, parts with differing dimensions and/or differing ratios among the drawings may be included.

In addition, the first through the eleventh embodiment given forthwith exemplifies devices and methods for embodying the technical ideas of the present invention, and those technical ideas are not limited to the following component materials, shapes, structures, arrangements or the like.

The technical ideas of the present invention may be modified into various modifications within the scope of the appended claims.

First Embodiment

Figure 19:
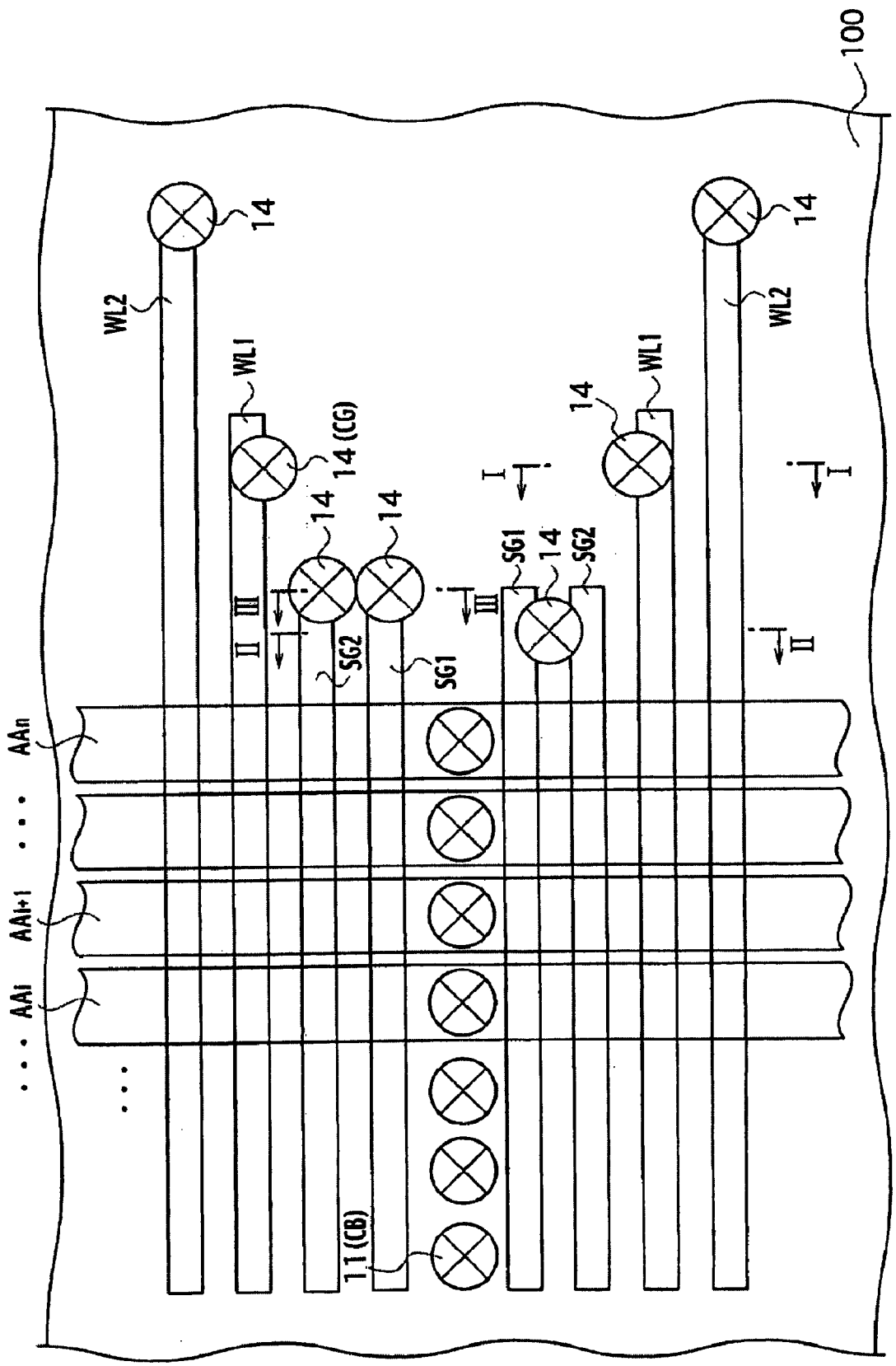
FIG. 19 is a plan view of a schematic pattern at the ends of word lines in the semiconductor memory according to the first embodiment of the present invention.

As shown in FIG. 19, a semiconductor memory according to the first embodiment of the present invention includes: multiple bit lines $BL_{j-2}$, $BL_{j-1}$, $BL_j$, $BL_{j+1}$, $BL_{j+2}$, ... (not shown in the drawing), which extend along the column length; multiple word lines WL1, WL2, ..., which extend along the row length; and multiple word line contacts (borderless contacts CG) 14, which are formed at the ends of those word lines WL1, WL2, ..., respectively; and have a structure where the word lines WL1, WL2, ... are linearly arranged and the lengths of at least two adjacent word lines along the row length differ from each other.

Alternatively, the semiconductor memory is structured such that each of the word line contacts (borderless contacts CG) 14 is in contact with part of one of the multiple word lines WL1, WL2, ..., but is not in contact with word lines adjacent to that one of the multiple word lines.

Alternatively, the semiconductor memory is structured such that each of the word line contacts (borderless contacts CG) 14 is in contact with part of the sidewall of one of the word lines WL1, WL2, ..., but is not in contact with a base semiconductor substrate 26.

Alternatively, the semiconductor memory is structured with a configuration further including: contact forming regions, which are formed at part of the multiple word lines WL1, WL2, ... and multiple select gate lines SG1, SG2, ... arranged parallel to the multiple word lines WL1, WL2, ...; and bit line contacts (CB) 11, which are formed within those contact forming regions.

Alternatively, the semiconductor memory is structured such that the contact forming regions are formed by removing at least one of the multiple word lines WL1, WL2, ... and multiple select gate lines SG1, SG2, ... as a defective pattern region.

Alternatively, the semiconductor memory is structured such that the contact forming regions have dimensions of one or an odd-number of times the width of each of the word lines WL1, WL2, ....

Alternatively, the semiconductor memory is structured such that the central ones of the multiple word lines WL1, WL2, ... are shorter than the other lines and that the other lines are longer than the central lines along the column length, providing a stepladder-shape pattern.

In the semiconductor memory according to the first embodiment of the present invention, the ends of the word lines WL1, WL2, ... are formed to be in a non-uniform pattern. Here, 'non-uniform pattern' means a pattern of neighboring ends with differing lengths, such as a stepladder-shape pattern, a parabolic pattern, an elliptical pattern, or a pattern of alternately differing lengths. Non-uniform patterns are applicable to not only word lines and select gate lines but also to bit lines. In addition, they are also applicable to the shape of a bit line extended region or to the shape of a word line extended region. Furthermore, the word lines WL1, WL2, ... are 'linearly' arranged. Here, 'linearly' arranged word lines means that they are formed with fixed lines and spaces. The widths of the word lines WL1, WL2, ... and widths of the select gate lines SG1, SG2, ... are the same, and both of the word lines and the select gate lines are formed with the same lines and spaces. Accordingly, the widths of the word lines WL1, WL2, ... and widths of the select gate lines SG1, SG2, . . . can be formed with a minimum line width.

As shown in FIG. 19, the semiconductor memory according to the first embodiment of the present invention includes: bit line patterns for multiple active regions $AA_i, AA_{i+1}, \ldots, AA_n$, which extend on a memory cell array along the column length; multiple word line patterns WL1, WL2, . . . , which are orthogonal to the bit line patterns, extend along the row length, and are non-uniformly arranged; multiple select gate line patterns SG1, SG2, . . . , which are arranged parallel to the multiple word line patterns; borderless contacts 14, which are formed near the ends of the word line patterns on the memory cell array, and are in contact with part of respective interconnects extended from the end of the memory cell array, but are not in contact with respective adjacent interconnects; and bit line contacts (CB) 11, which are formed within contact forming regions by removing part of the multiple word line patterns and select gate line patterns through double exposure.

REFERENCE EXAMPLE

As shown in a schematic plan view of FIG. 1, a semiconductor memory, according to a reference example of the present invention, includes a memory cell array 1 and a peripheral circuit 3. A peripheral region B of the memory cell array has a lock-and-key shaped interconnect pattern used to prevent partial overlapping. On the other hand, A memory cell array has an interconnect pattern with fixed lines and spaces for the bit lines BL.

Figure 2:
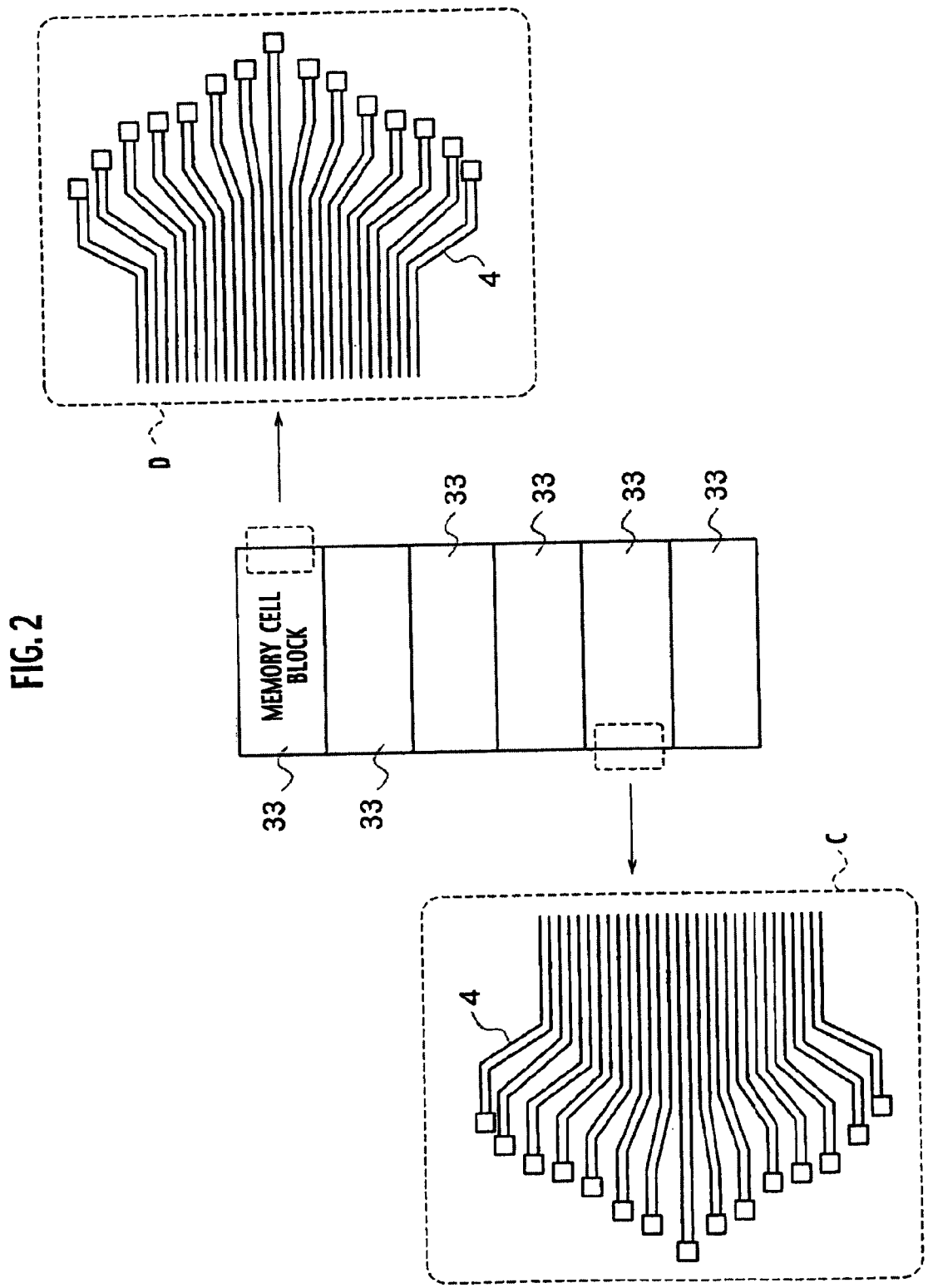
FIG. 2 is a schematic plan view of the nearby regions of memory cell blocks of the semiconductor memory according to the reference example of the present invention.

Similarly, schematic plan views C and D of the semiconductor memory in FIG. 2, according to the reference example of the present invention, shows that diagonal interconnect patterns 4 are used to form contact holes near the peripheral regions of memory cell blocks 33.

Figure 3:
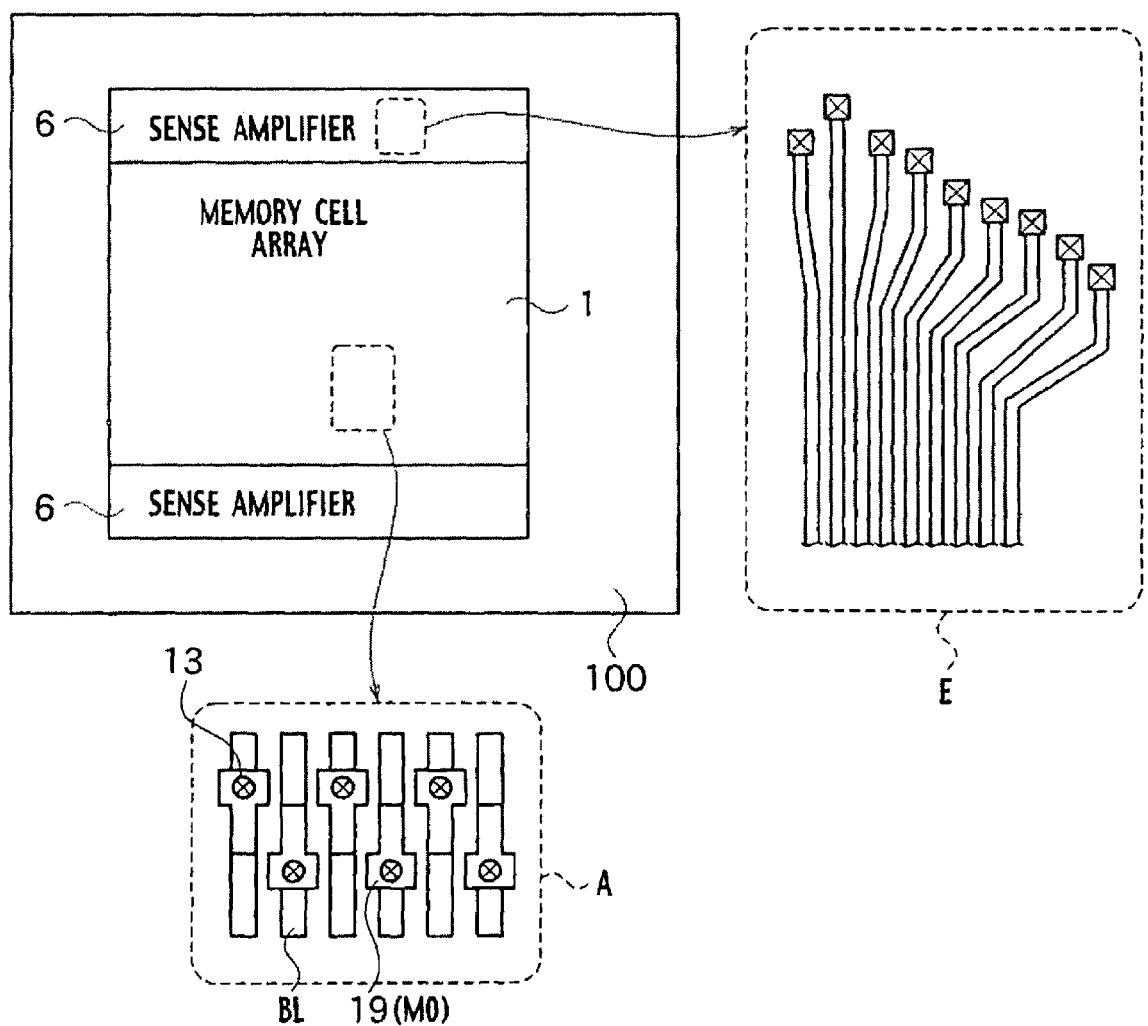
FIG. 3 is a schematic plan view of the nearby regions of a memory cell array and sense amplifiers of the semiconductor memory according to the reference example of the present invention.

In addition, a schematic plan view E of the semiconductor memory in FIG. 3, according to the reference example of the present invention, shows that there are diagonal interconnect patterns 4 in sense amplifier 6 regions, which are peripheral regions of the memory cell array 1 formed on the semiconductor chip 100, while A shows that bit line extended regions 19 in the memory cell array 1 respectively have wider regions surrounding via contacts 13.

Figure 4:
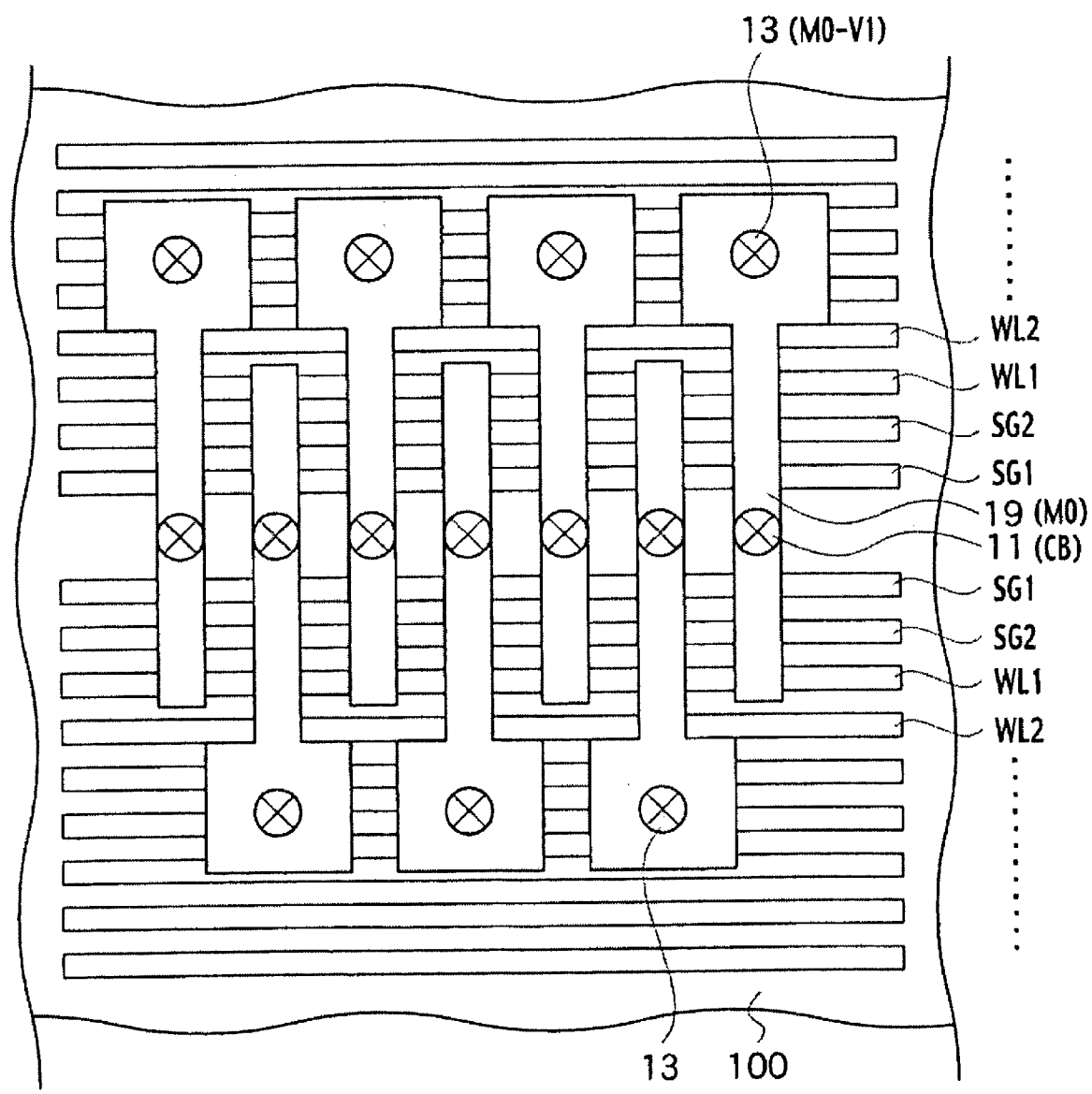
FIG. 4 is a schematic plan view of the nearby regions of bit line extended regions within the memory cell array of the semiconductor memory according to the reference example of the present invention.

FIG. 4 shows that, in the semiconductor memory of the reference example of the present invention, via contacts (M0-V1) 13 and bit line contacts 11 are formed in the nearby regions of respective bit line extended regions (M0) 19, which is in the memory cell array formed on the semiconductor chip 100.

(Double Exposure)

The double exposure used for a fabrication method for the semiconductor memory according to the first embodiment of the present invention is described forthwith.

Figure 5:
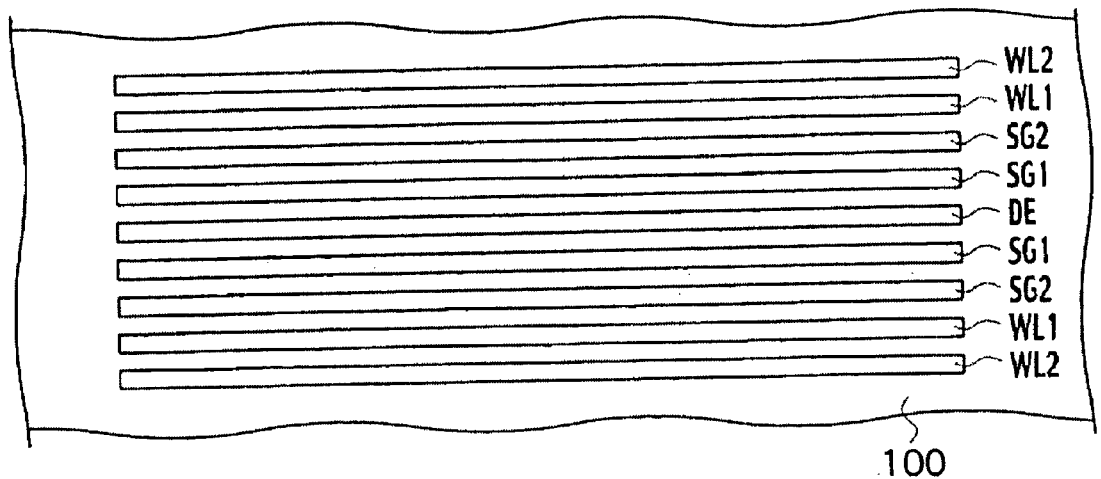
FIG. 5 is a plan view of a pattern for describing a step of a fabrication method for a semiconductor memory according to a first embodiment of the present invention.

As shown in FIG. 5, word line WL1 and WL2 patterns, select gate line SG1 and SG2 patterns, and a dummy interconnect DE pattern are formed on the semiconductor chip 100.

Figure 6:
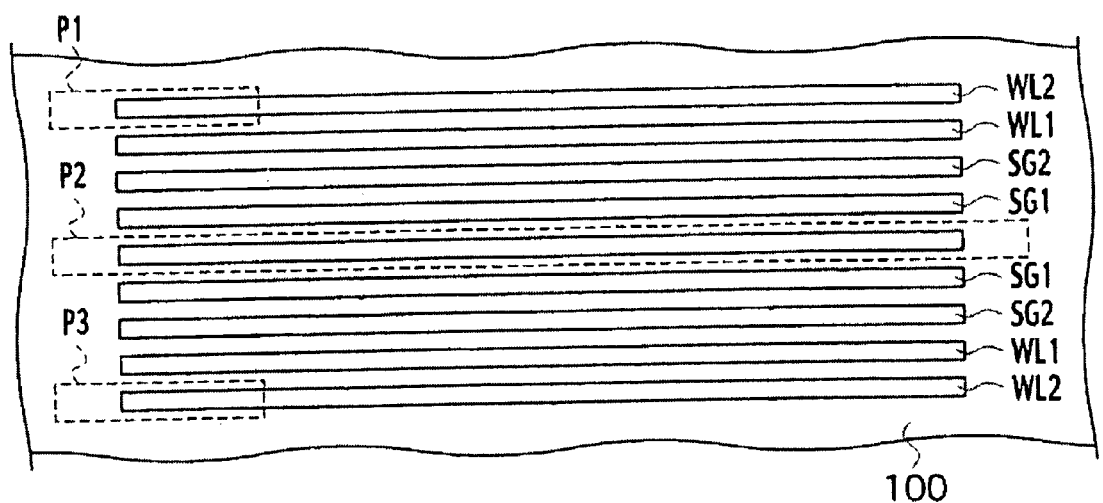
FIG. 6 is a plan view of a pattern for describing a step of a fabrication method for the semiconductor memory according to the first embodiment of the present invention.

As shown in FIG. 6, patterns P1 and P3 in the peripheral regions of word lines WL2 and a pattern P2 for the dummy interconnect DE are subjected to double exposure, and those patterns P1, P2, and P3 are removed.

Figure 7:
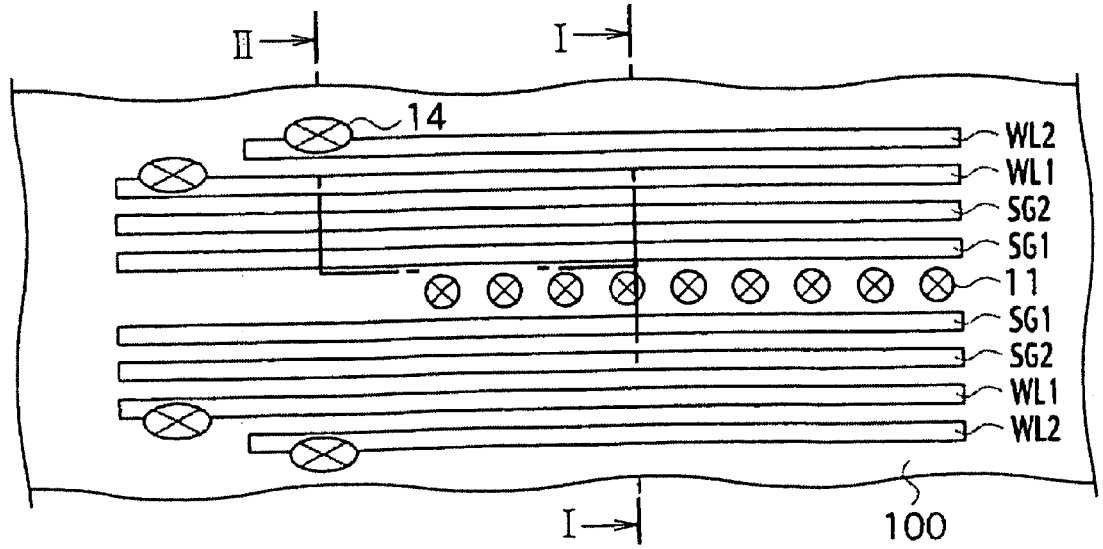
FIG. 7 is a plan view of a pattern for describing a step of a fabrication method for the semiconductor memory according to the first embodiment of the present invention.

As shown in FIG. 7, borderless contacts (CG) 14 are formed in spaces, which are formed by removing the patterns P1 and P3, and the bit line contacts (CB) 11 are linearly formed in a space, which is formed by removing the pattern P3.

First Modified Example of the First Embodiment

Figure 8:
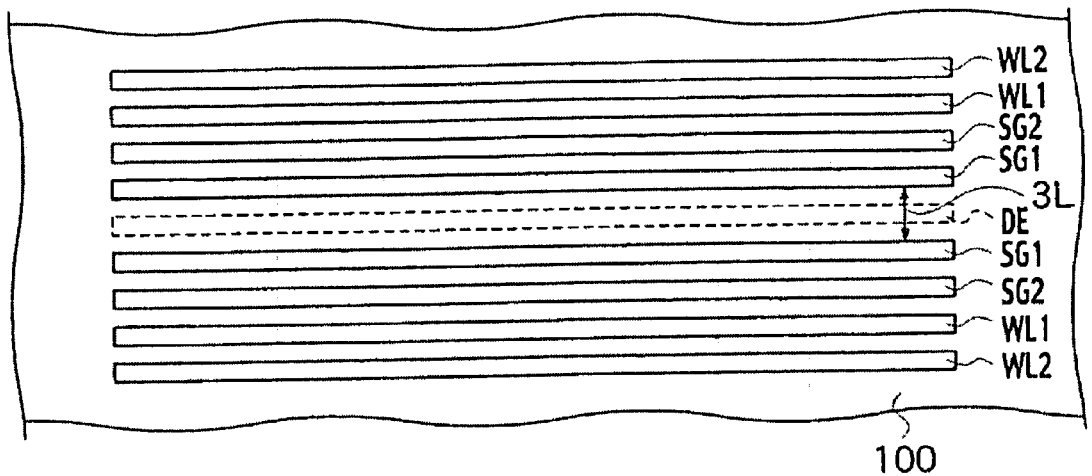
FIG. 8 is a plan view of a pattern for describing a step of a fabrication method for a semiconductor memory according to a first modified example of the first embodiment of the present invention.

FIG. 8 shows a plan view of a pattern for describing a step of a semiconductor memory fabrication method according to a first modified example of the first embodiment of the present invention; wherein 3 L denotes the interval between a pair of select gate line SG1 patterns, which is prepared for bit line contacts (CB) 11. L denotes the minimum line and space (minimum line width). As shown with a dashed line in FIG. 8, a pattern structure of FIG. 8 may be achieved by removing only a single dummy interconnect DE through double exposure. For example, as shown in FIG. 8, the semiconductor memory, according to the first modified example of the first embodiment of the present invention, includes a contact forming region with dimensions three times the minimum line width L, which is formed by removing one of the multiple word line patterns and select gate line patterns through double exposure.

Second Modified Example of the First Embodiment

Figure 9:
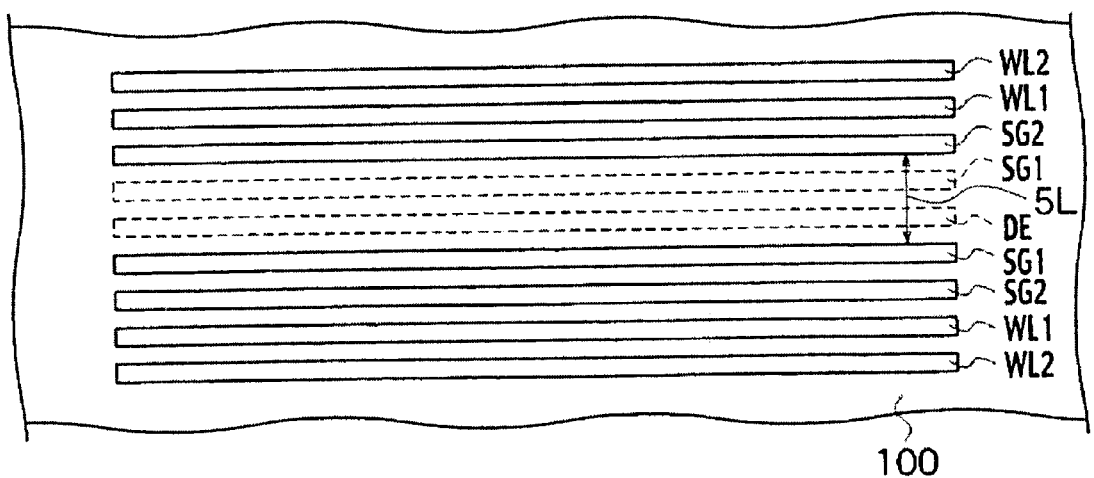
FIG. 9 is a plan view of a pattern for describing a step of a fabrication method for a semiconductor memory according to a second modified example of the first embodiment of the present invention.

FIG. 9 shows a plan view of a pattern for describing a step of a semiconductor memory fabrication method, according to a second modified example of the first embodiment of the present invention, where 5 L denotes the interval between the select gate line SG2 pattern and the select gate line SG1 pattern, which is prepared for bit line contacts (CB) 11. As shown with dashed lines in FIG. 9, a pattern structure of FIG. 9 may be achieved by removing only a single dummy interconnect DE and a single select gate line SG1 through double exposure. For example, as shown in FIG. 9, the semiconductor memory according to the second modified example of the first embodiment of the present invention, includes a contact forming region with dimensions five times the minimum line width L, which is formed by removing two of the multiple word line patterns and select gate line patterns through double exposure.

Third Modified Example of the First Embodiment

Figure 10:
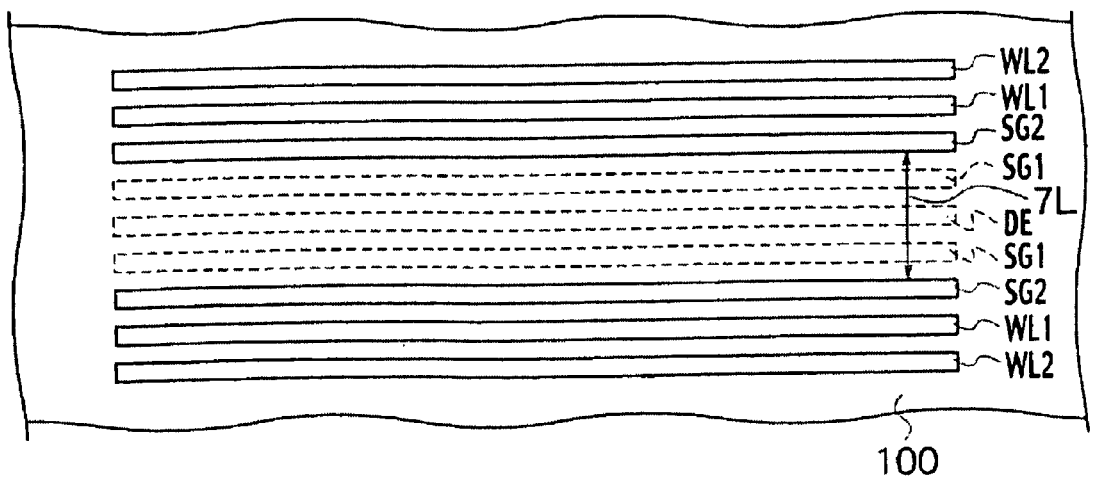
FIG. 10 is a plan view of a pattern for describing a step of a fabrication method for a semiconductor memory according to a third modified example of the first embodiment of the present invention.

FIG. 10 shows a plan view of a pattern for describing a step of a semiconductor memory fabrication method according to a third modified example of the first embodiment of the present invention, where 7 L denotes the interval between a pair of select gate line SG2 patterns, which is prepared for bit line contacts (CB) 11. As shown with dashed lines in FIG. 10, a pattern structure of FIG. 10 may be achieved by removing the dummy interconnect DE and a pair of select gate lines SG1 through double exposure.

For example, as shown in FIG. 10, the semiconductor memory, according to the third modified example of the first embodiment of the present invention, includes a contact forming region with dimensions seven times the minimum line width L, which is formed by removing three of the multiple word line patterns and select gate line patterns through double exposure.

According to the first through the third modified example of the first embodiment of the present invention, examples including a contact forming region with dimensions three, five, or seven times the minimum line width L, respectively, are described; however, those dimensions are naturally not limited to those values. The contact-forming region may have dimensions, for example, one, nine, or eleven times the minimum line width L. In addition, typically, the contact-forming region may have dimensions 2k−1 (where k denotes a positive integer of 1 or greater) times the minimum line width L.

(Fabrication Method)

A semiconductor memory fabrication method, according to the first embodiment of the present invention, is described forthwith. FIGS. 11 through 14 correspond to the schematic cross-sectional device structure cut along the line I-I in FIG. 7. FIG. 15 corresponds to the schematic cross-sectional device structure cut along the line II-II in FIG. 7.

Figure 11:
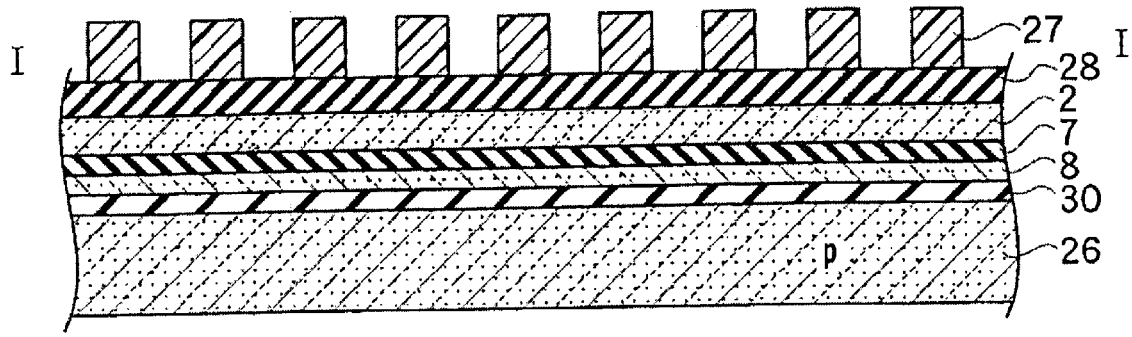
FIG. 11 is a schematic cross-sectional device structure cut along the line I-I in FIG. 7 for describing a step of a fabrication method for the semiconductor memory according to the first embodiment of the present invention.

As shown in FIG. 11, once a gate insulating film 30, a floating gate 8 made of polysilicon, for example, an inter-gate insulating film 7 made of an alumina film, for example, and a control gate 2 made of polysilicon, for example, are successively formed on a well or a semiconductor substrate 26, a hard mask 28 is then formed across the entire surface of the substrate, and resist 27 patterns are formed through lithography and patterning.

Figure 12:
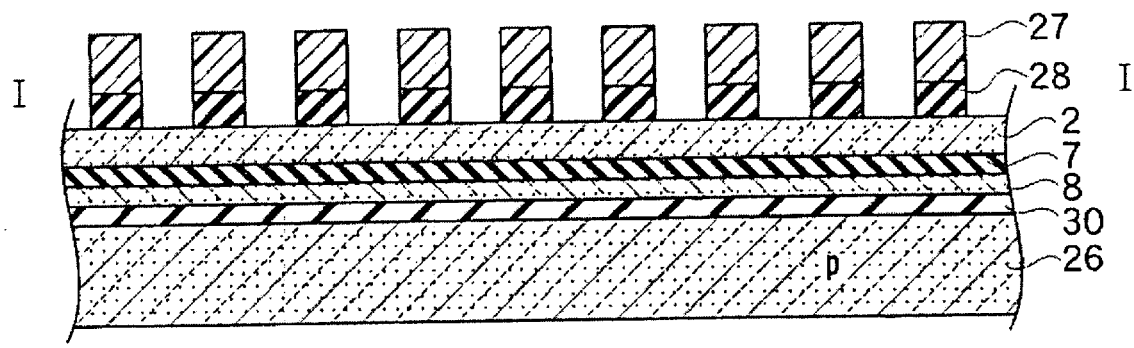
FIG. 12 is a schematic cross-sectional device structure cut along the line I-I in FIG. 7 for describing a step of the fabrication method for the semiconductor memory according to the first embodiment of the present invention.

As shown in FIG. 12, the hard mask 28 is etched and removed using the resist 27 patterns as a mask until the control gate 2 surface is exposed.

Figure 13:
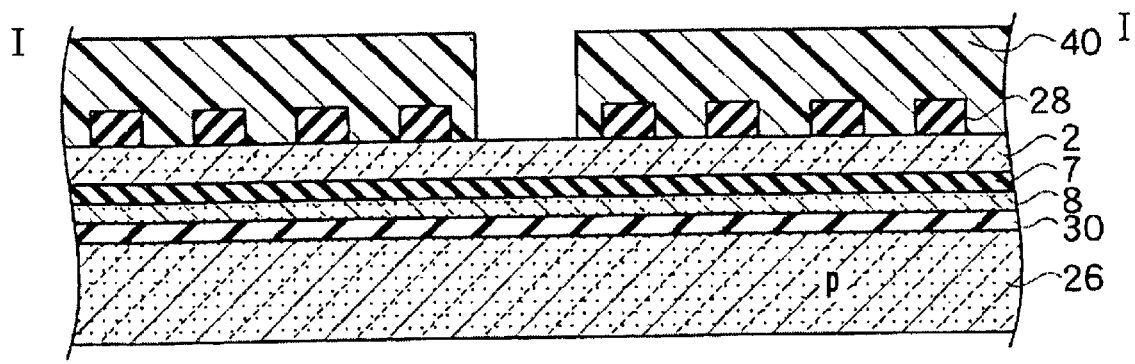
FIG. 13 is a schematic cross-sectional device structure cut along the line I-I in FIG. 7 for describing a step of the fabrication method for the semiconductor memory according to the first embodiment of the present invention.

As shown in FIG. 13, once resist 40 patterns are formed through lithography and patterning, one of the hard mask 28 patterns is removed through double exposure.

Figure 14:
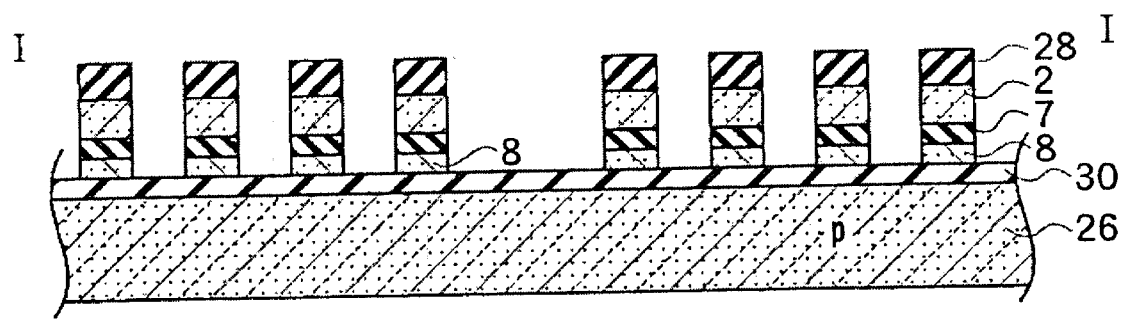
FIG. 14 is a schematic cross-sectional device structure cut along the line I-I in FIG. 7 for describing a step of the fabrication method for the semiconductor memory according to the first embodiment of the present invention.
Figure 15:
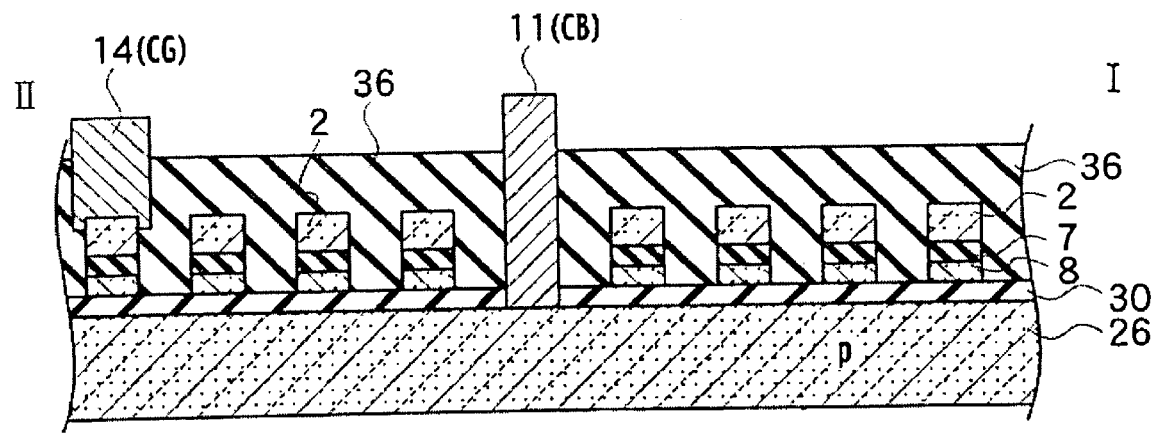
FIG. 15 is a schematic cross-sectional device structure cut along the line II-I in FIG. 7 for describing a step of the fabrication method for the semiconductor memory according to the first embodiment of the present invention.

As shown in FIG. 14, once the resist 40 is removed, the entire surface is etched using the hard mask 28 patterns, and stacked-gate structures, each configured from the gate insulating film 30, the floating gate 8, the inter-gate insulating film 7, and the control gate 2 are formed.

As shown in FIG. 15, once an interlayer insulating film 36 is deposited across the entire surface, a bit line contact (CB) 11 and a borderless contact (CG) 14 are formed through lithography and patterning.

Fourth Modified Example of the First Embodiment

A semiconductor memory fabrication method, according to a fourth modified example of the first embodiment of the present invention, is described forthwith.

Figure 16:
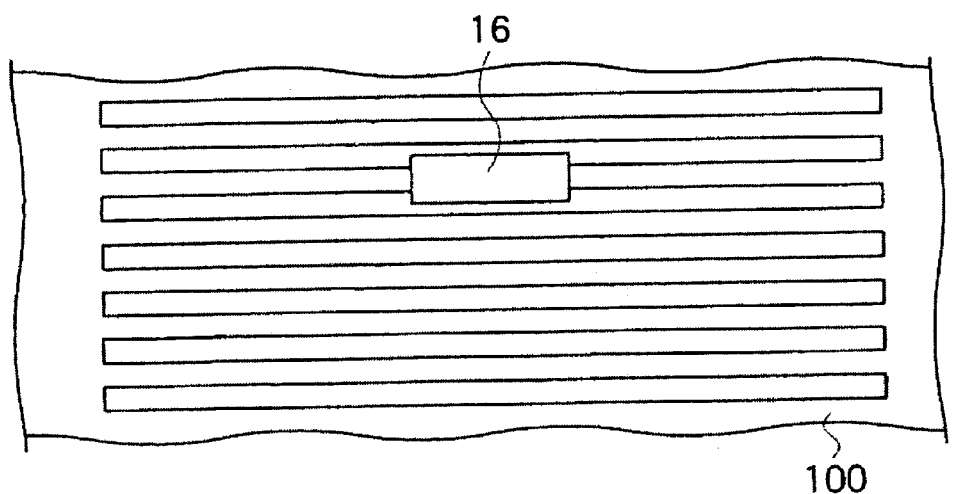
FIG. 16 is a plan view of a schematic pattern for describing a step of a fabrication method for a semiconductor memory according to a fourth modified example of the first embodiment of the present invention.

As shown in FIG. 16, once word line patterns or select gate line patterns are formed on the semiconductor chip 100, a double-exposure region 16, which becomes a borderless contact forming region on the electrode interconnect patterns, is formed.

The double-exposure region 16 may be formed by carrying out an exposure and development process (PEP) twice for the same resist through only reticle replacement.

Figure 17:
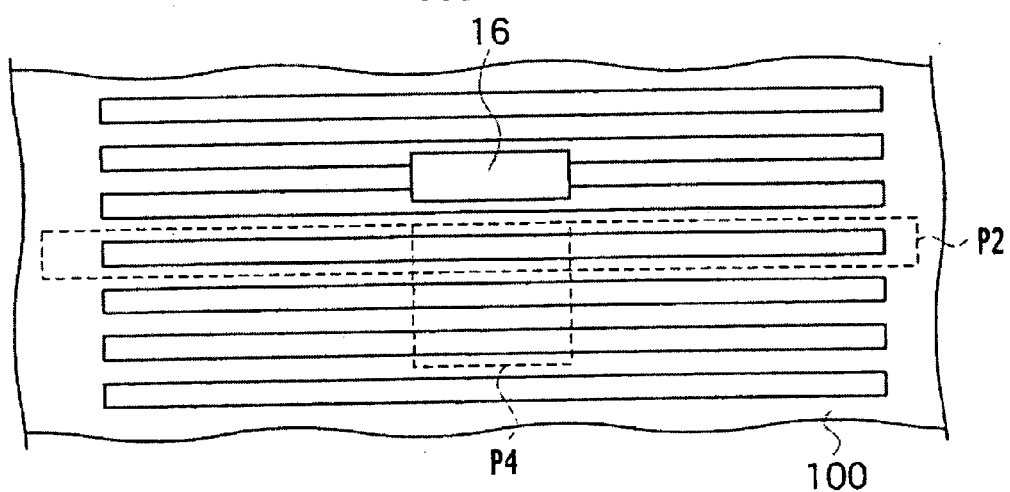
FIG. 17 is a plan view of a schematic pattern for describing a step of the fabrication method for the semiconductor memory according to the fourth modified example of the first embodiment of the present invention.

As shown in FIG. 17, a pattern P2, which becomes a bit line contact (CB) 11 forming region, and a pattern P4, which becomes a source line contact (CS) 12 forming region, are subjected to double exposure to remove the patterns P2 and P4.

Figure 18:
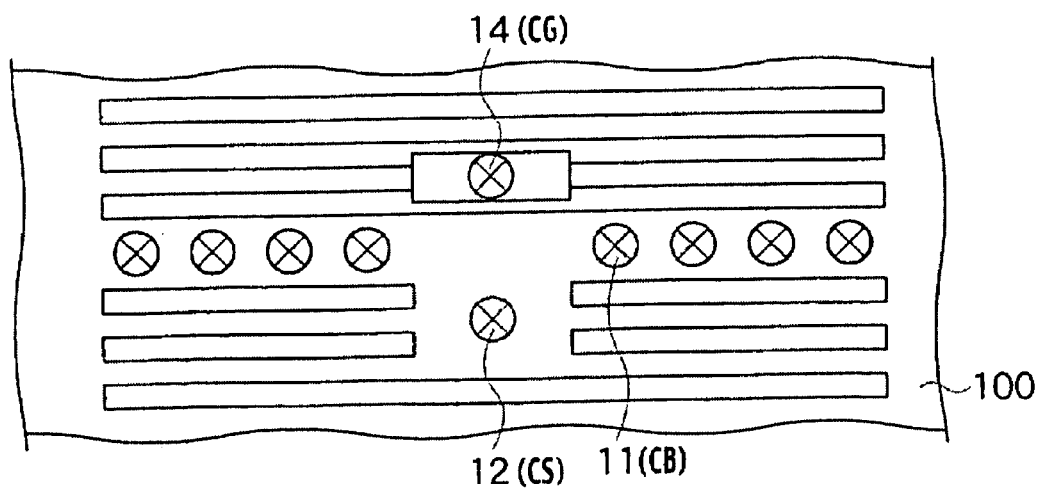
FIG. 18 is a plan view of a schematic pattern for describing a step of the fabrication method for the semiconductor memory according to the fourth modified example of the first embodiment of the present invention.

The bit line contacts (CB) 11 are linearly formed, and the source line contact (CS) 12 and the borderless contact (CG) 14 are formed, as shown in FIG. 18.

Fifth Modified Example of the First Embodiment

FIG. 19 shows, a schematic plan pattern of the ends of the word lines in the semiconductor memory, according to the first embodiment of the present invention, which has a step-ladder-shape or a non-uniform pattern shape.

(Cross-Sectional Device Structure)

Figure 20:
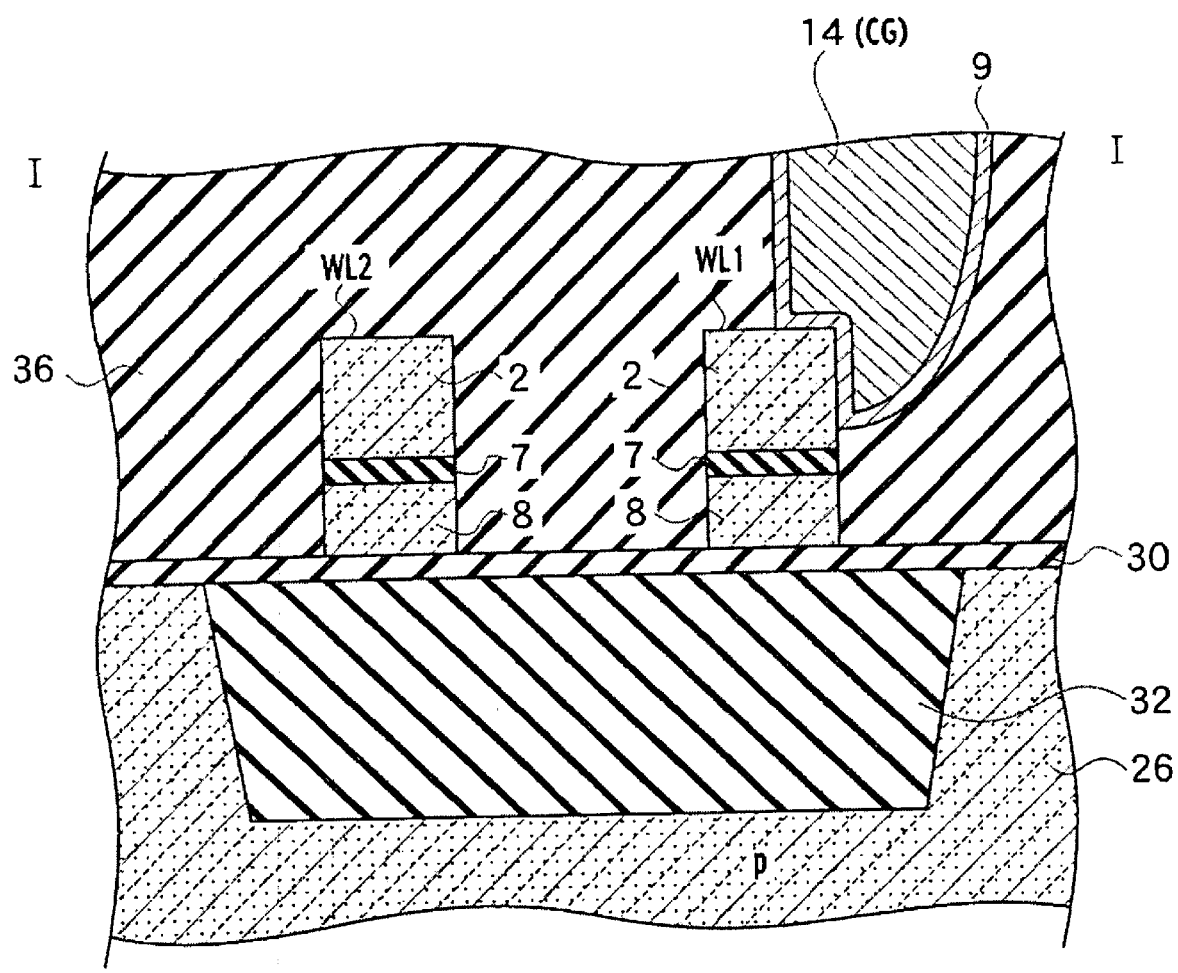
FIG. 20 is a schematic cross-sectional device structure of a borderless contact cut along the line I-I in FIG. 19.

As shown in FIG. 20, the schematic cross-sectional device structure of the borderless contact region cut along the line I-I in FIG. 19 is configured from a gate insulating film 30, which is formed on a device isolating region (STI) 32 formed in a well or the semiconductor substrate 26, stacked-gate structures, each configured from a floating gate 8, an inter-gate insulating film 7, and a control gate 2 formed in the interlayer insulating film 36 on the gate insulating film 30, and a borderless contact 14, which is in contact with the control gate 2 via a barrier metal 9. As shown in FIGS. 19 and 20, the borderless contacts 14 are formed near the ends of the word line patterns on the memory cell array, and are in contact with part of an interconnect extended from the ends of the memory cell array, but are not in contact with interconnects adjacent to that interconnect. More specifically, as shown in FIG. 20, the borderless contacts 14 are in contact with part of the sidewalls of the interconnect extended from the end of the memory cell array, but are not in contact with the base well or the semiconductor substrate 26.

Figure 21:
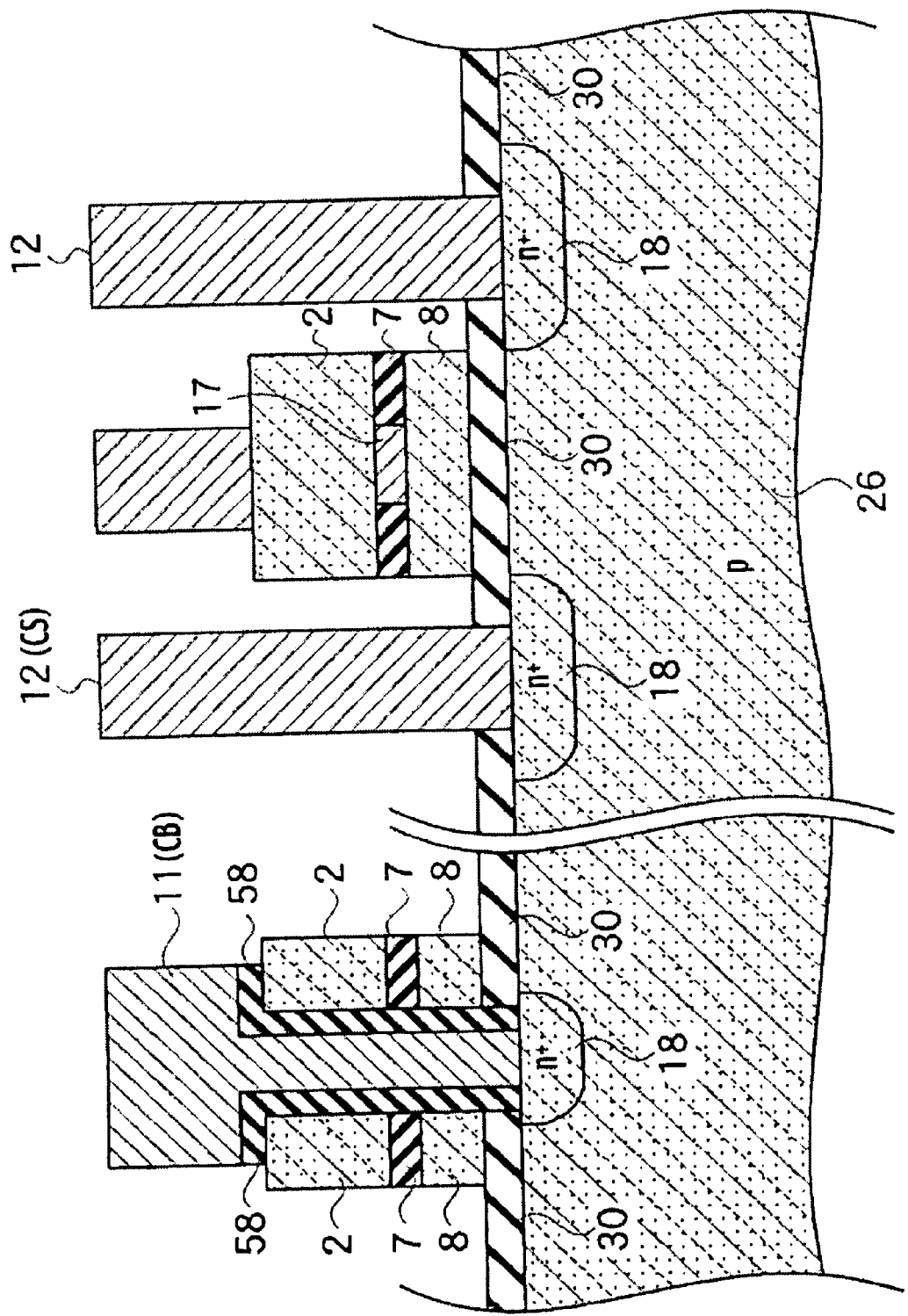
FIG. 21A is a cross-sectional device structure of a bit line contact (CB) 11 formed in a self-aligned manner.
FIG. 21B is a cross-sectional device structure of source line contacts (CS) 12.

An exemplary contact structure with a relatively relaxed cell rule pitch is represented by a bit line contact (CB) 11 and source line contacts (CS) 12. The bit line contact (CB) 11 is self aligned and formed to partially overlap with stacked-gate structures via interlayer insulating films 58, and the source line contacts (CS) 12 are formed to be adjacent to those stacked gate structures as shown in FIG. 21B. Each stacked gate structure is configured from a floating gate 8, an inter-layer insulating film 7, and a control gate 2, as shown in FIG. 21A.

Figure 22:
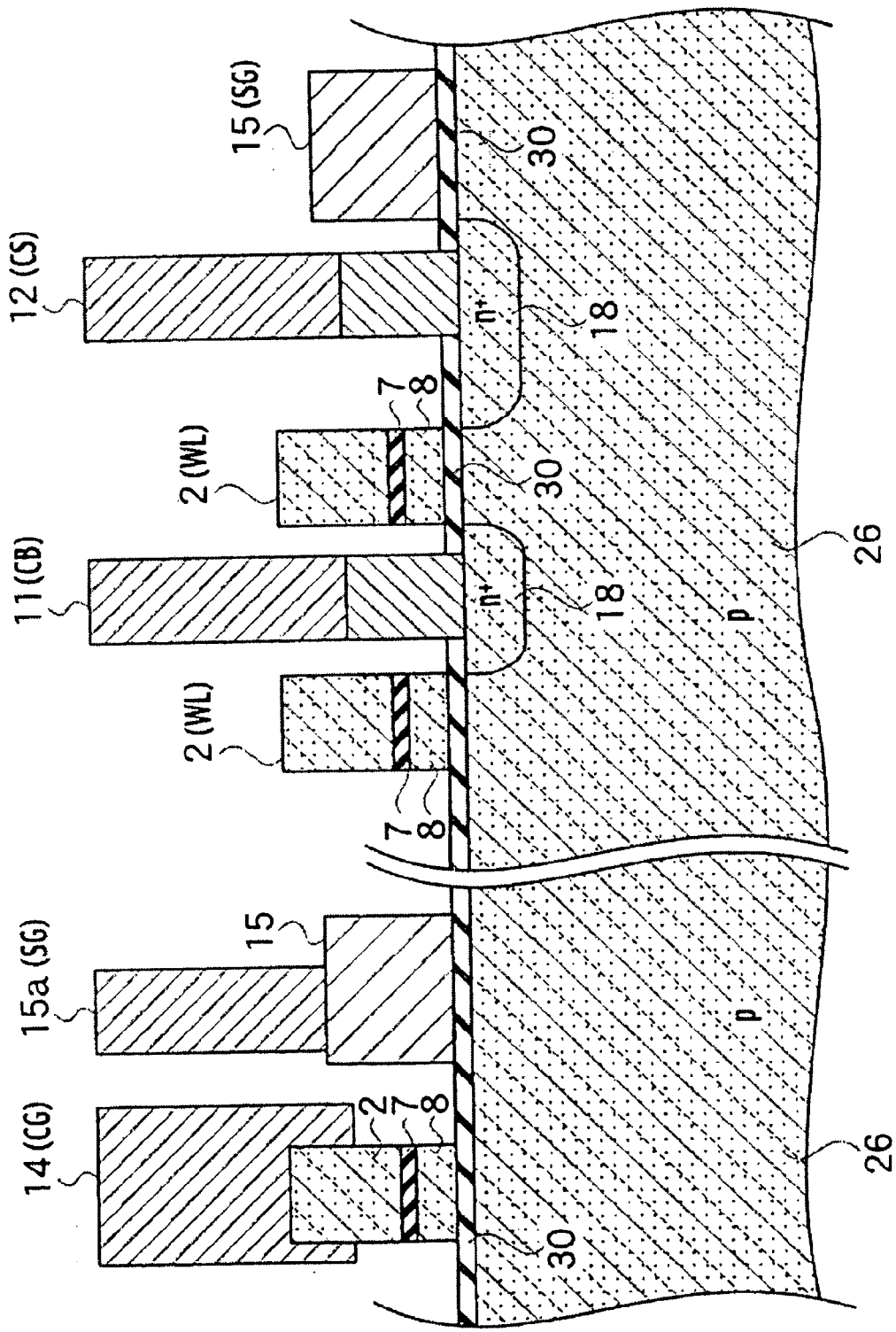

On the other hand, an exemplary contact structure with a further miniaturized cell rule pitch is represented by a borderless contact 14, a select gate contact (SG) 15a, and a bit line contact (CB) 11 and a source line contact (CS) 12 for diffusion layers as shown in FIG. 22B, as compared to the stacked-gate structure configured from the floating gate 8, the interlayer insulating film 7, and the control gate 2 as shown in FIG. 22A. The borderless contact 14 is formed on the control gate 2, and the select gate contact (SG) 15a is formed on the select gate electrode 15.

Figure 23:
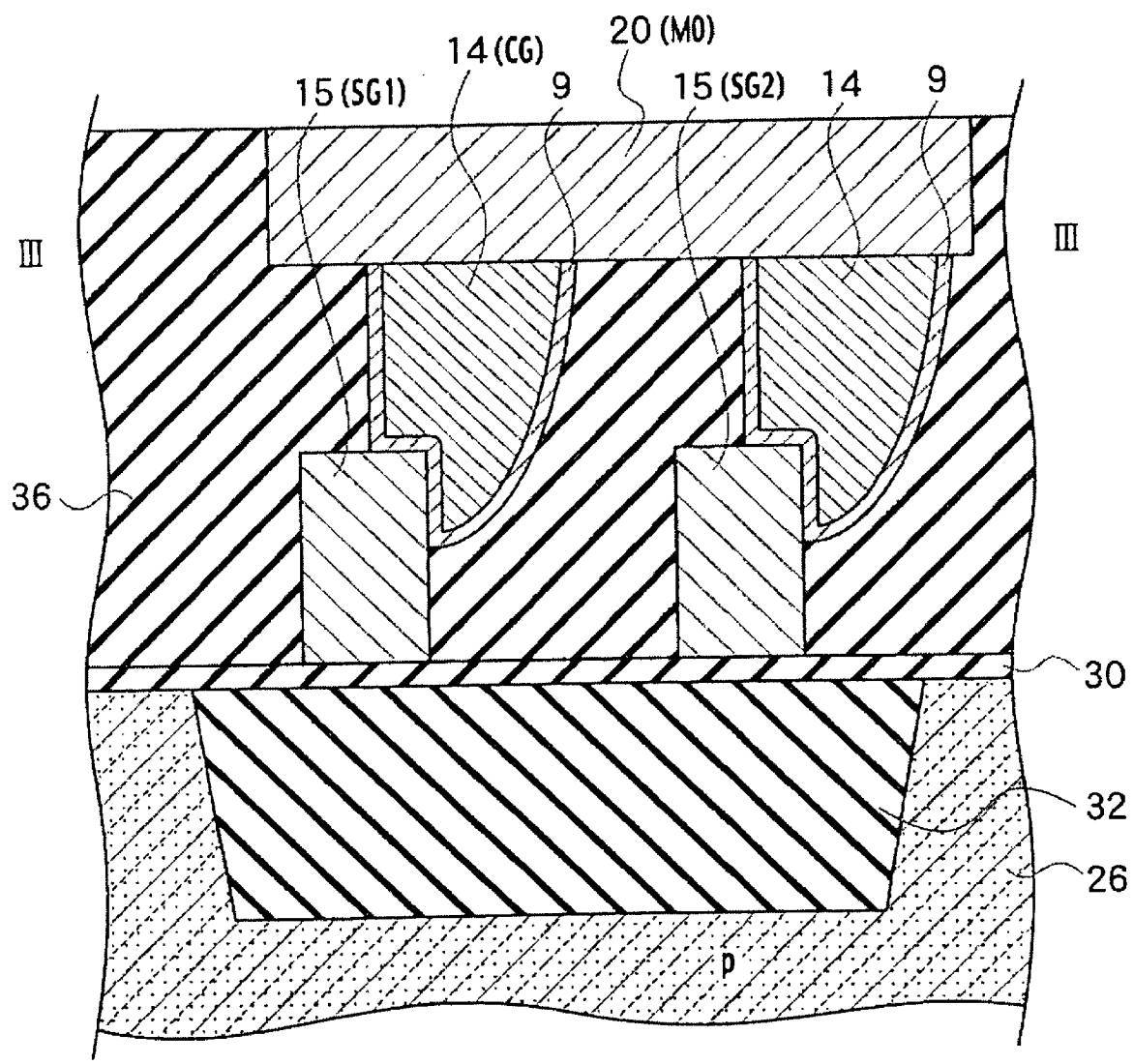
FIG. 23 is schematic cross-sectional device structures of borderless contacts and a select gate line extended region (M0) cut along the line III-III in FIG. 19.

As shown in FIG. 23, a schematic cross-sectional device structure of the borderless contacts 14 (CG) and a select gate line extended region (M0) 20 cut along the line III-III in FIG. 19 is configured from the gate insulating film 30, which is arranged on a device isolating region (STI) 32 formed in a well or the semiconductor substrate 26, select gate electrodes (SG1, SG2) 15, which are formed in the interlayer insulating film 36 on the gate insulating film 30, the borderless contacts 14, which are in contact with the select gate electrodes 15 via barrier metals 10, and the select gate line extended region (M0) 20 which is in contact with the borderless contacts 14.

Figure 24:
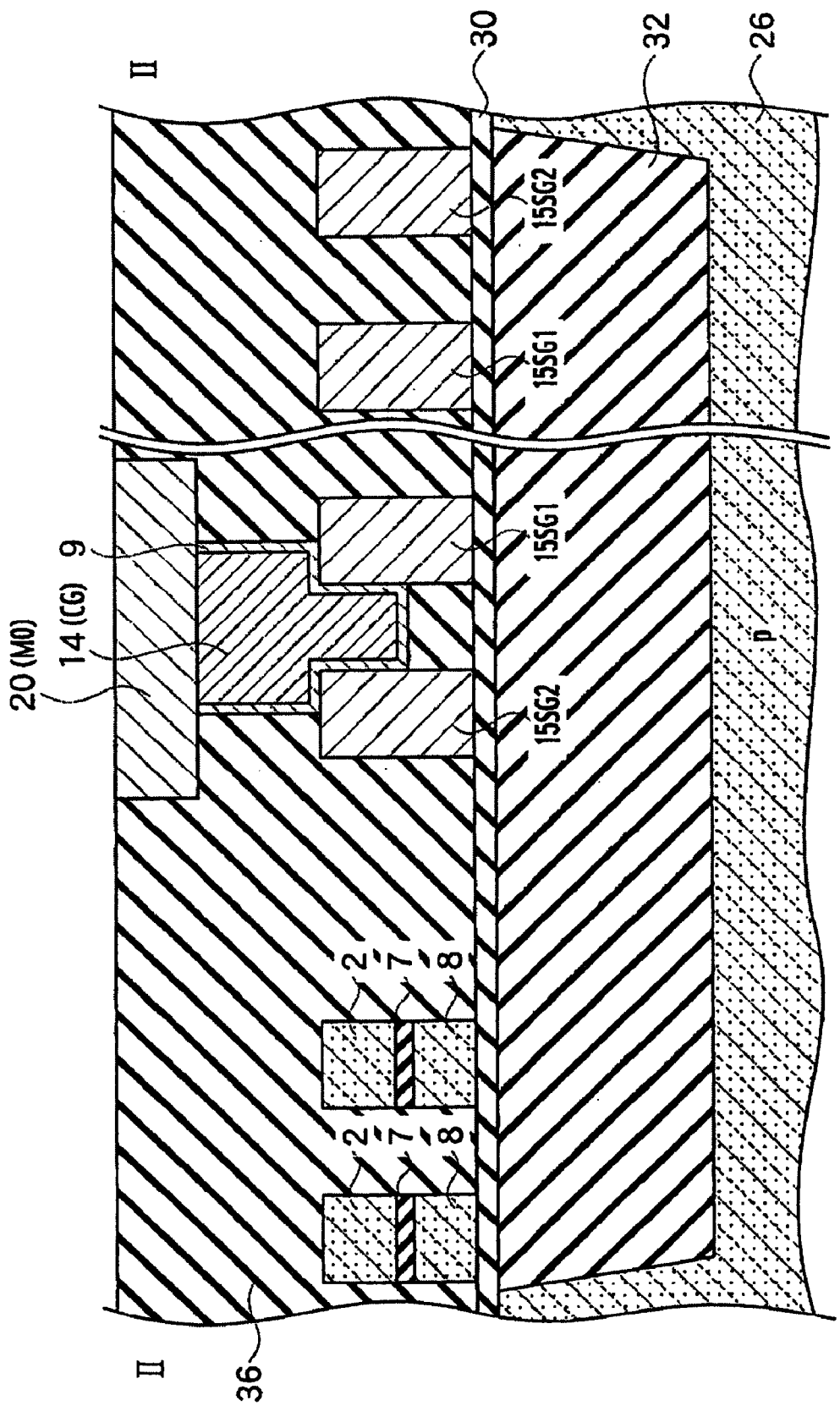
FIG. 24 is schematic cross-sectional device structures of a borderless contact and a select gate line extended region (M0) cut along the line II-II in FIG. 19.

As shown in FIG. 24, a schematic cross-sectional device structure of the borderless contact 14 (CG) and the select gate line extended region (M0) 20 cut along the line II-II in FIG. 19 is configured from the gate insulating film 30, which is arranged on the device isolating region (STI) 32 formed in a well or the semiconductor substrate 26, the select gate electrodes (SG1, SG2) 15, which are formed in the interlayer insulating film 36 on the gate insulating layer 30, the borderless contact 14, which is in contact with the select gate electrodes 15 via the barrier metal 10, and the select gate line extended region (M0) 20 which is in contact with the borderless contact 14. The borderless contact 14 is in contact with both respective parts of a pair of the select gate lines 15 extended from the end of the memory cell array, but are not in contact with interconnects adjacent to that pair.

As described above, the semiconductor memory, according to the first embodiment of the present invention, allows formation and arrangement of the borderless contacts 14, the bit line contacts (CB) 11, and the source line contacts (CS) 12 with a sufficient pattern margin using a non-uniform pattern of the ends of the word lines WL or the control gate lines and the select gate lines SG. The non-uniform pattern is formed by partially removing those ends thereof of the word lines WL or the control gate lines and the select gate lines S6 double exposure.

Second Embodiment

Figure 25:
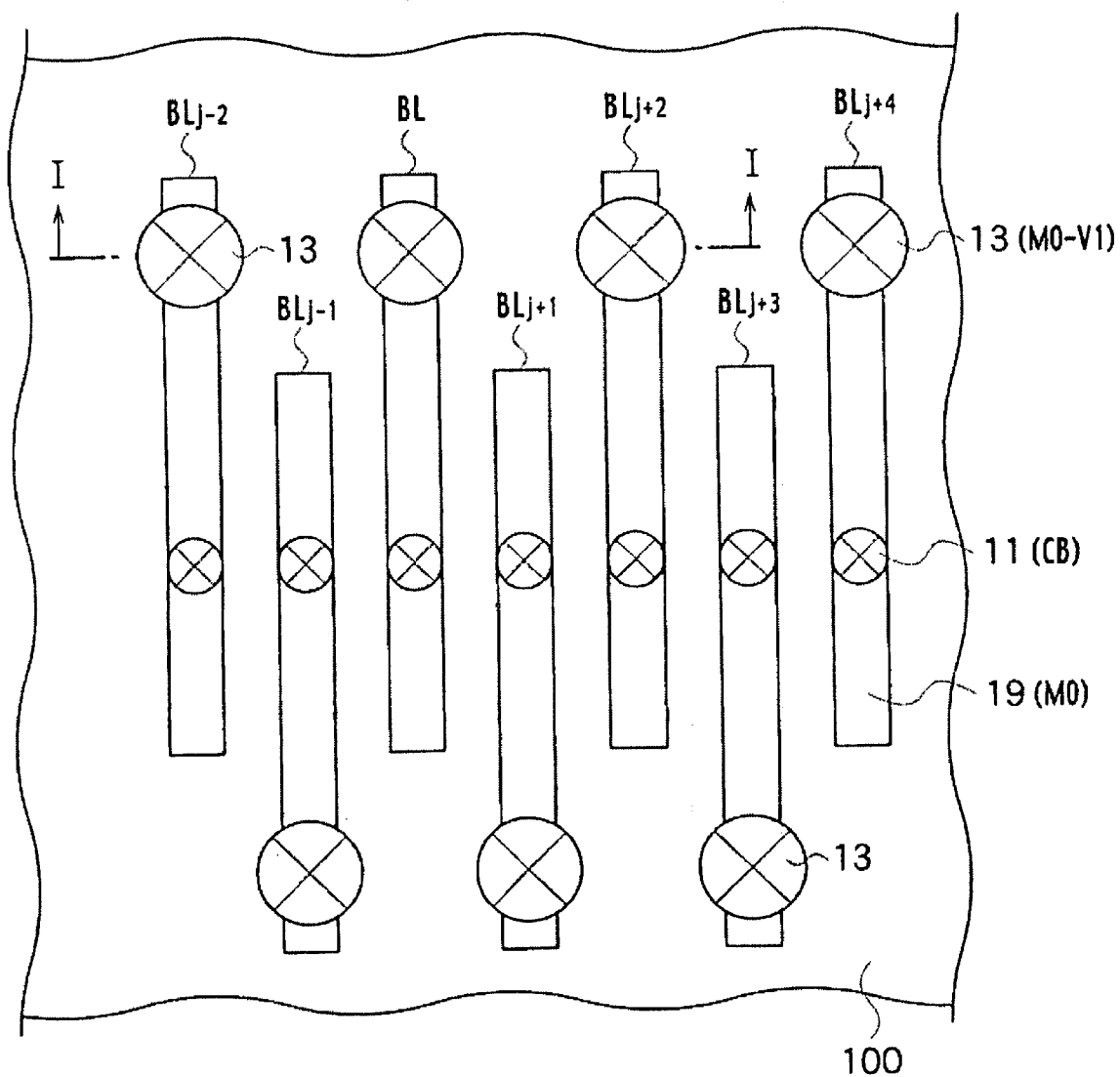
FIG. 25 is a plan view of a schematic pattern for describing an arrangement of bit line contacts (CB) and via contacts (M0-V1) in the nearby regions of bit line extended regions (M0) in a semiconductor memory according to a second embodiment of the present invention.

As shown in FIG. 25, a semiconductor memory, according to the second embodiment of the present invention, includes: multiple bit lines $BL_{j-2}$, $BL_{j-1}$, $BL_j$, $BL_{j+1}$, $BL_{j+2}$, $BL_{j+3}$, $BL_{j+4}$, . . . , which extend on a memory cell array along the column length; multiple word lines $WL_{i-1}$, $WL_i$, $WL_{i+1}$, . . . (not shown in the drawing), which are orthogonal to the bit lines $BL_{j-2}$, $BL_{j-1}$, $BL_j$, $BL_{j+1}$, $BL_{j+2}$, $BL_{j+3}$, $BL_{j+4}$, . . . and extend along the row length; and via contacts (M0-V1) 13, which are linearly formed along the row length on the bit lines $BL_{j-2}$, $BL_{j-1}$, $BL_j$, $BL_{j+1}$, $BL_{j+2}$, $BL_{j+3}$, $BL_{j+4}$, . . . sandwiching a defective bit line pattern region at the ends of those bit lines, which line up along the row length. The lines are formed in a striped non-uniform pattern.

Alternatively, the semiconductor memory may be structured such that a pitch of the via contacts (M0-V1) 13 along the row length may be twice that of the bit lines $BL_{j-2}$, $BL_{j-1}$, $BL_j$, $BL_{j+1}$, $BL_{j+2}$, $BL_{j+3}$, $BL_{j+4}$, . . . along the row length.

Alternatively, the semiconductor memory may be structured such that metal filled layers are further included, and the via contacts (M0-V1) 13 are in contact with respective parts of the metal filled layers.

Alternatively, the semiconductor memory may be structured such that each metal filled layer is made of a tungsten electrode film 50.

As shown in FIG. 25, the semiconductor memory, according to the second embodiment of the present invention, includes a non-uniform pattern of bit line extended regions (M0) 19, which are formed to correspond to the bit lines $BL_{j-2}$, $BL_{j-1}$, $BL_j$, $BL_{j+1}$, $BL_{j+2}$, $BL_{j+3}$, $BL_{j+4}$, . . . formed on the semiconductor chip 100. A pitch of the arranged via contact (M0-V1) 13 patterns is twice that of the arranged bit line contact (CB) 11 patterns.

In other words, while referencing FIG. 25, the semiconductor memory, according to the second embodiment of the present invention, includes: multiple bit line $BL_{j-2}$, $BL_{j-1}$, $BL_j$, $BL_{j+1}$, $BL_{j+2}$, $BL_{j+3}$, $BL_{j+4}$, . . . patterns, which extend on the memory cell array along the column length; multiple word line patterns (not shown in the drawing), which are orthogonal to the bit line patterns and extend along the row length; stripe bit line extended regions (M0) 19, which are arranged non-uniformly on the respective bit line patterns; and via contacts (M0-V1) 13, which are formed on the respective bit line extended regions (M0) 19 sandwiching regions formed by removing respective patterns P5 and P6 (FIG. 26) or parts of the bit line extended regions (M0) 19 through double exposure. The via contacts (M0-V1) 13 are arranged near the ends of the bit line extended regions (M0) 19 along the row length at a pitch twice that of the patterns of the bit line extended regions (M0) 19.

Alternatively, the semiconductor memory may be structured such that metal filled layers, which are made of a tungsten electrode film (M0) 50 and are formed in the memory cell array, are further included, and the via contacts (M0-V1) 13, which are formed near the ends of the bit line extended regions (M0) 19, are in contact with part of the tungsten electrode film (M0) 50.

(A Method of Forming Bit Line Extended Regions)

Figure 26:
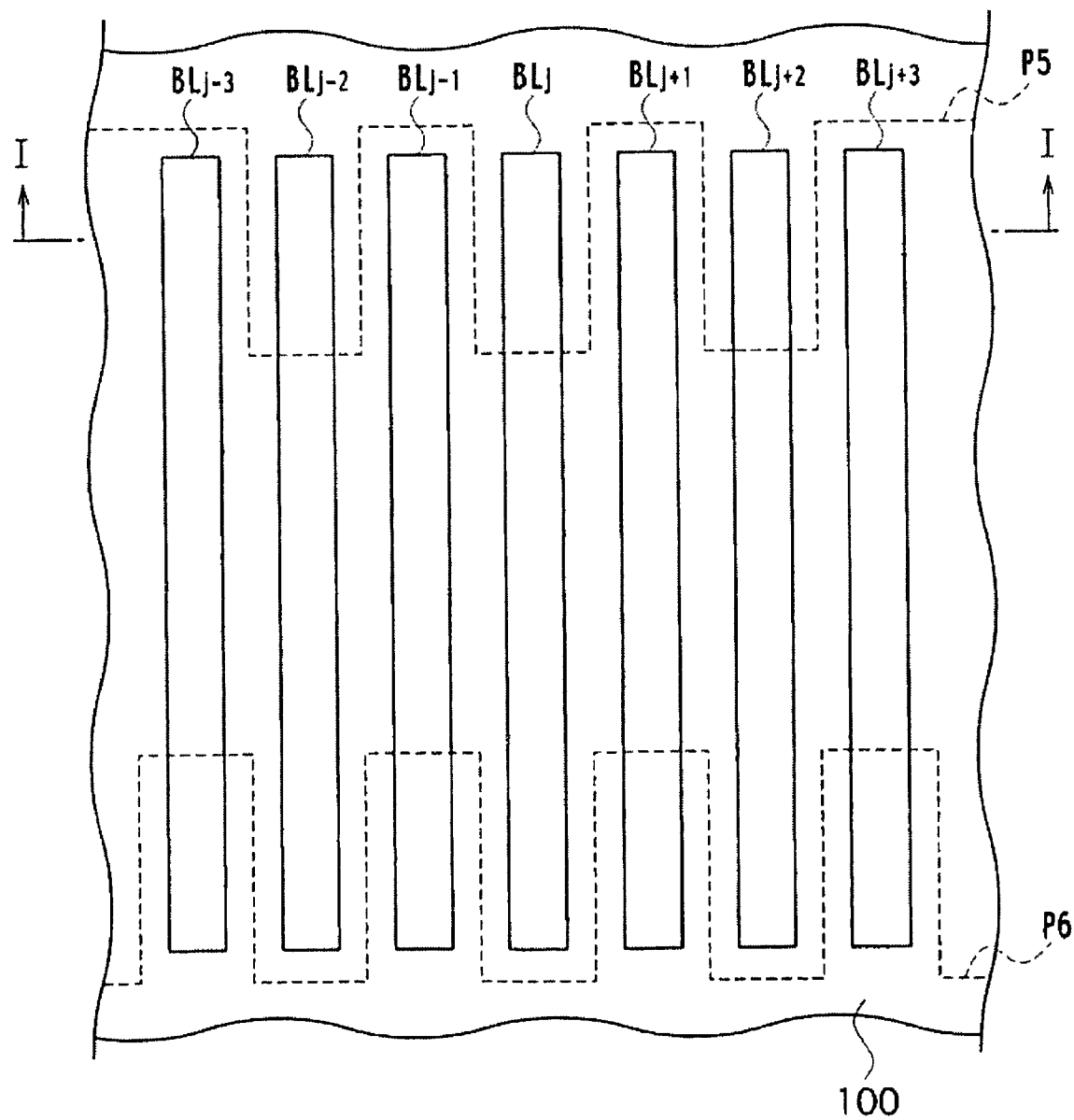
FIG. 26 is a plan view of a schematic pattern for describing a step of a fabrication method for the semiconductor memory according to the second embodiment of the present invention.

As schematically shown in FIG. 26, once electrode patterns for the bit line extended regions (M0) 19 corresponding to the bit lines $BL_{j-2}$, $BL_{j-1}$, $BL_j$, $BL_{j+1}$, $BL_{j+2}$, $BL_{j+3}$, $BL_{j+4}$, . . . are formed on the semiconductor chip 100, patterns P5 and P6 are then formed.

Figure 27:
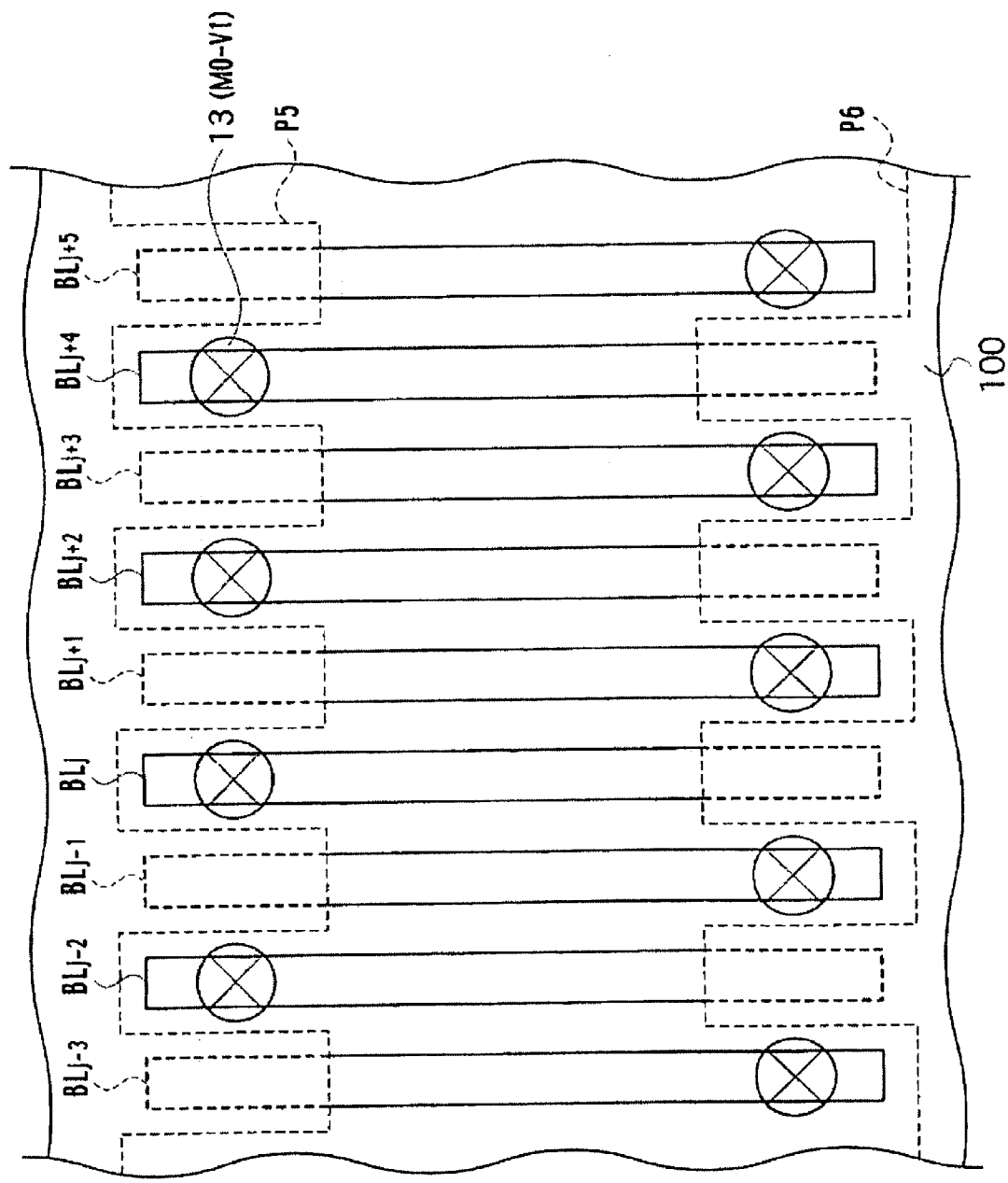
FIG. 27 is a plan view of a schematic pattern for describing a step of the fabrication method for the semiconductor memory according to the second embodiment of the present invention.

As schematically shown in FIG. 27, end portions corresponding to the patterns P5 and P6 are removed through double exposure, and the via contacts (M0-V1) 13 are then formed at a pitch twice that of the minimum line and space.

In addition, as shown in FIG. 25, the bit line contacts (CB) 11 are formed for the respective bit line extended regions (M0) 19.

(Fabrication Method)

The semiconductor memory, according to the second embodiment of the present invention, can be formed to include the schematic cross-sectional device structure cut along the line I-I in FIG. 25 through the following fabrication process.

Figure 28:
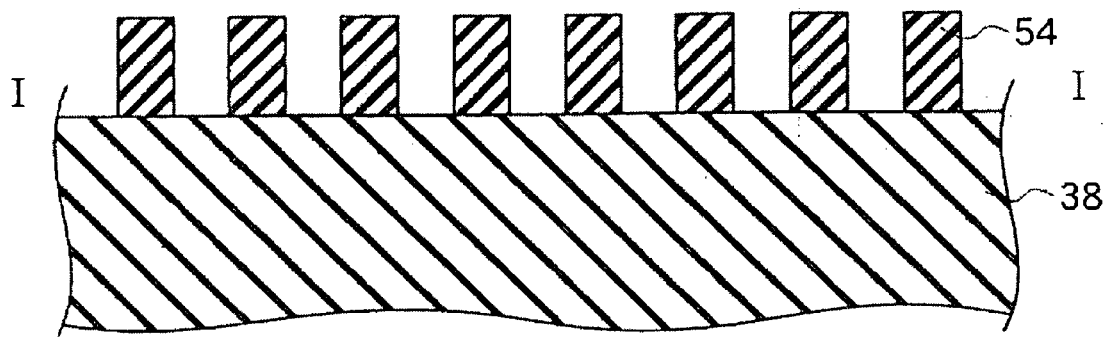
FIG. 28 is a schematic cross-sectional device structure cut along the line I-I in FIG. 26 for describing a step of the fabrication method for the semiconductor memory according to the second embodiment of the present invention.

As shown in FIG. 28, metallic interconnect forming patterns corresponding to the bit line extended regions (M0) 19 are formed on an interlayer insulating film 38 using a mask 54.

Figure 29:
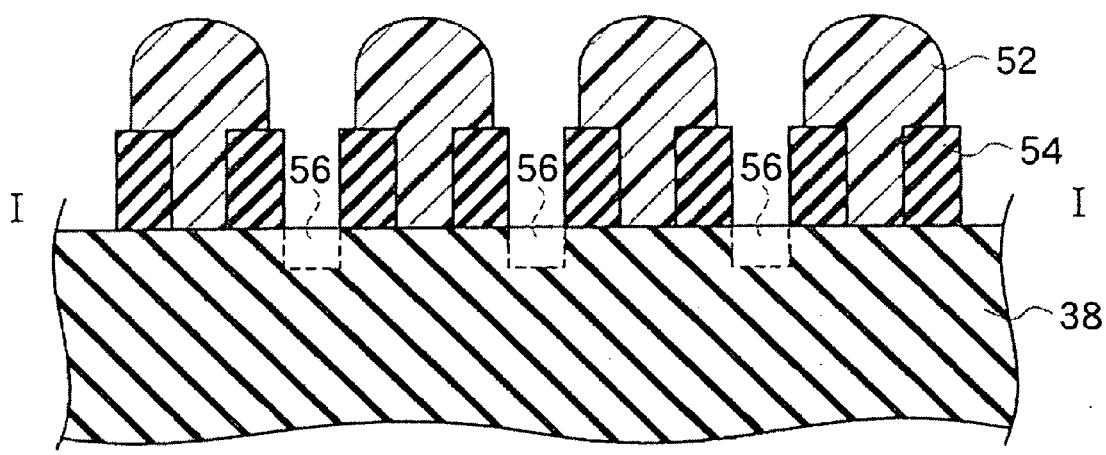
FIG. 29 is a schematic cross-sectional device structure cut along the line I-I in FIG. 26 for describing a step of the fabrication method for the semiconductor memory according to the second embodiment of the present invention.

As shown in FIG. 29, once resist 52 patterns are formed through lithography and patterning, the interlayer insulating film 38 is subjected to etching to form metal filled layer forming regions 56.

Figure 30:
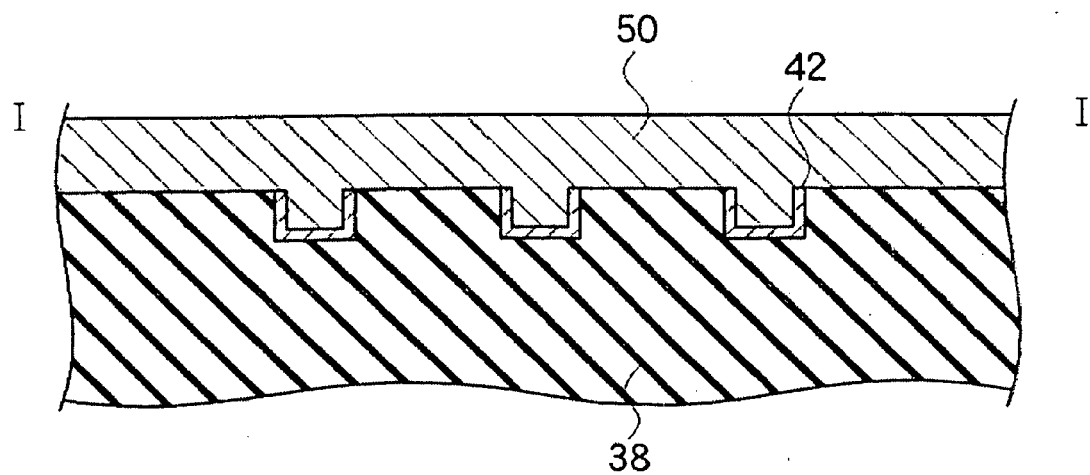
FIG. 30 is a schematic cross-sectional device structure cut along the line I-I in FIG. 26 for describing a step of the fabrication method for the semiconductor memory according to the second embodiment of the present invention.

As shown in FIG. 30, once barrier metals 42 are formed on the inner sides of the metal filled layer forming regions 56, resists 52 and the mask 54 are removed, and a thick tungsten electrode film 50 is formed over the entire surface.

Figure 31:
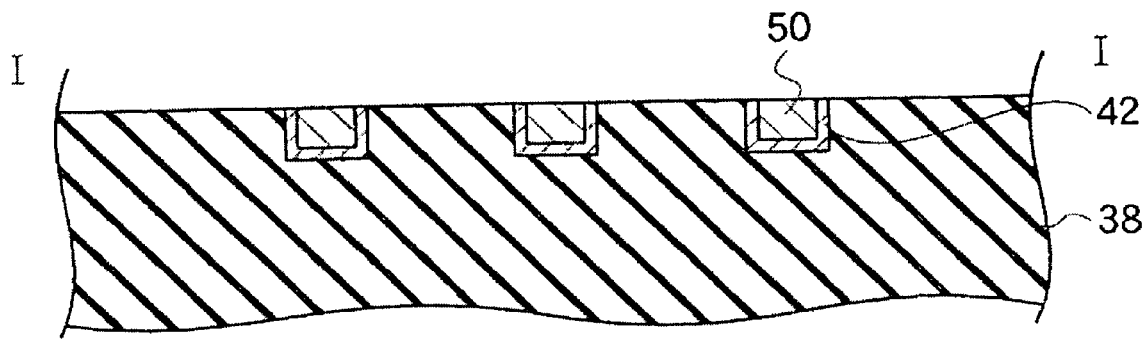
FIG. 31 is a schematic cross-sectional device structure cut along the line I-I in FIG. 26 for describing a step of the fabrication method for the semiconductor memory according to the second embodiment of the present invention.

As shown in FIG. 31, the tungsten electrode film 50 is planarized and removed through etching or chemical mechanical polishing (CMP) until the interlayer insulating film 38 is exposed.

Figure 32:
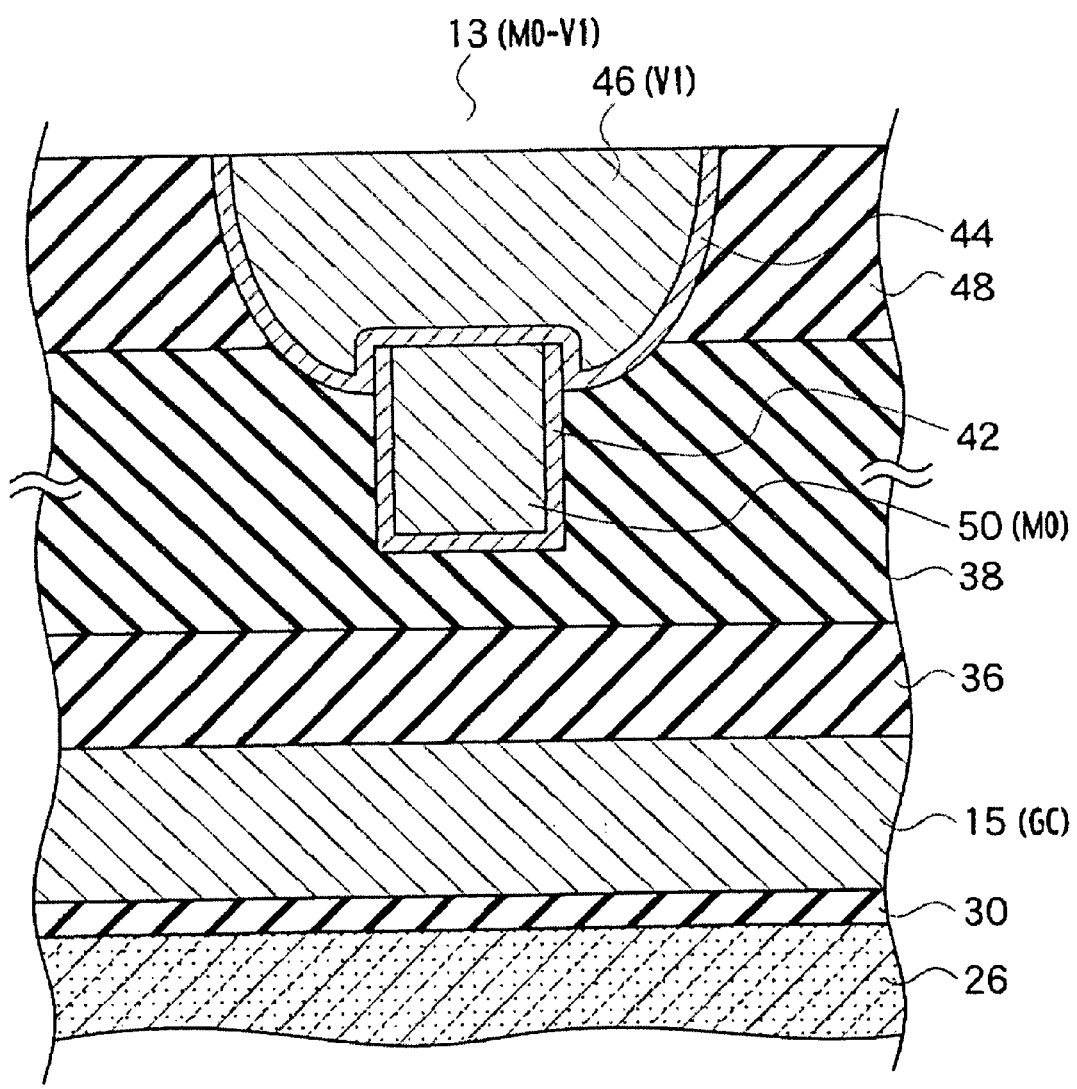
FIG. 32 is a schematic cross-sectional device structure in the nearby regions of a via contact (M0-V1)

In addition, as shown in a magnified diagram of FIG. 32, once an interlayer insulating film 48 is deposited, patterns for forming the via contacts 13 are formed, and the interlayer insulating film 48 is removed through etching until the surface of the tungsten electrode film (M0) is exposed in the same manner as with the above process. Afterwards, once a barrier metal 44 is formed, a via contact (V1) 46 is filled with a metallic film or polysilicon or a related material, and the via contact (M0-V1) 13 is formed.

The semiconductor memory, according to the second embodiment of the present invention, allows arrangement and formation of the via contacts (M0-V1) 13 at a pitch twice that of the minimum line and space width by using a non-uniform pattern even for the bit line extended regions (M0) 19.

Third Embodiment

Figure 33:
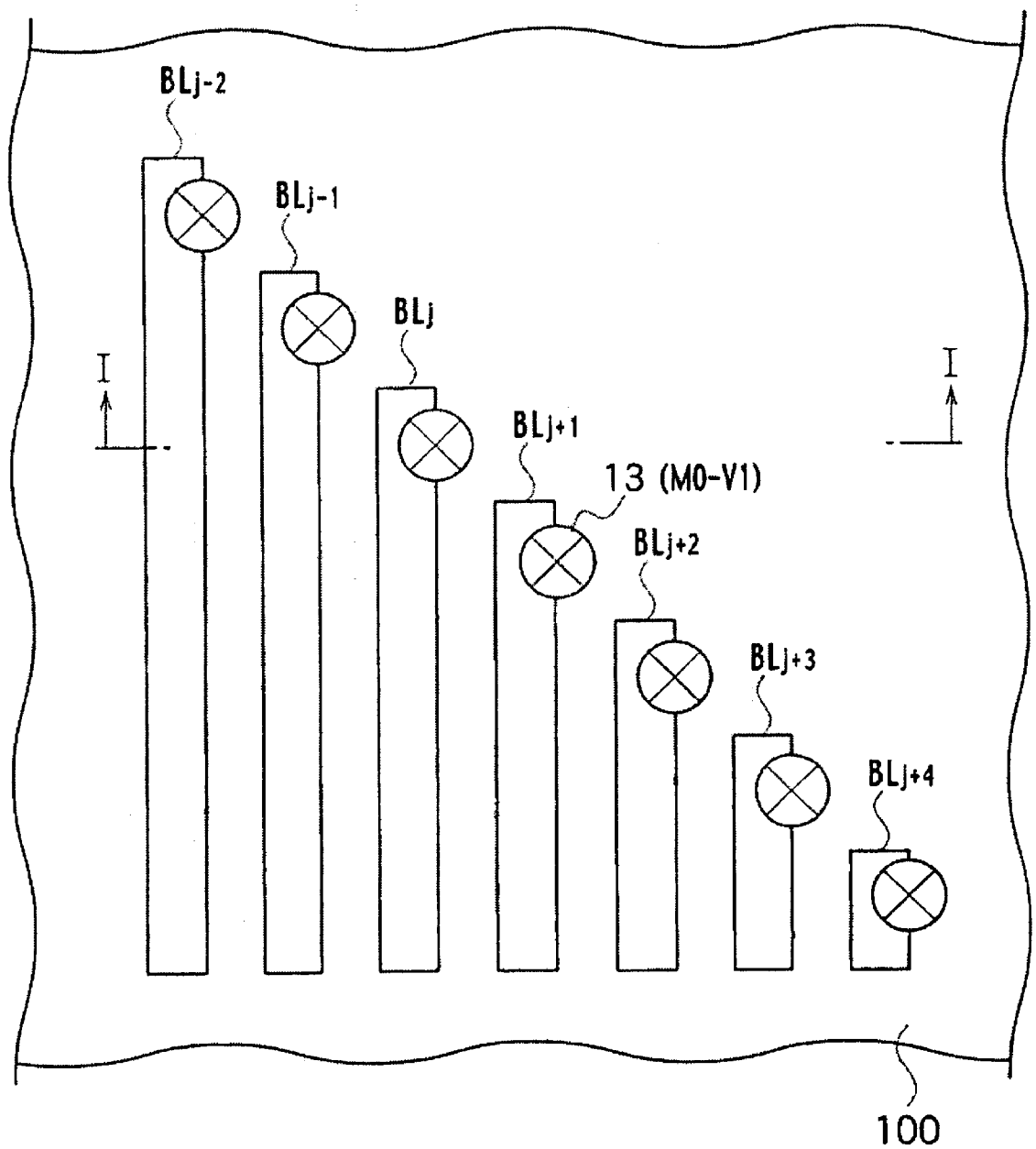
FIG. 33 is a plan view of a schematic pattern for describing an arrangement of via contacts (M0-V1) in the nearby regions of bit line ends in a semiconductor memory according to a third embodiment of the present invention.

As shown in FIG. 33, a semiconductor memory, according to the third embodiment of the present invention, includes: multiple bit lines $BL_{j-2}$, $BL_{j-1}$, $BL_j$, $BL_{j+1}$, $BL_{j+2}$, $BL_{j+3}$, $BL_{j+4}$, . . . , which extend along the column length; multiple word lines $WL_{i-1}$, $WL_i$, $WL_{i+1}$, . . . (not shown in the drawing), which extend along the row length; and multiple via contacts (M0-V1) 13, which are formed on the ends of the bit lines $BL_{j-2}$, $BL_{j-1}$, $BL_j$, $BL_{j+1}$, $BL_{j+2}$, $BL_{j+3}$, $BL_{j+4}$, . . . , respectively. The bit lines $BL_{j-2}$, $BL_{j-1}$, $BL_j$, $BL_{j+1}$, $BL_{j+2}$, $BL_{j+3}$, $BL_{j+4}$, . . . are linearly formed, and the lengths of at least two adjacent bit lines along the column length differ from each other.

Alternatively, the semiconductor memory may be structured such that the via contacts (M0-V1) 13 are in contact with part of one of the multiple bit lines $BL_{j-2}$, $BL_{j-1}$, $BL_j$, $BL_{j+1}$, $BL_{j+2}$, $BL_{j+3}$, $BL_{j+4}$, . . . , but are not in contact with bit lines adjacent to that bit line.

Alternatively, via contacts (V1-M1) 10 made of an electrode film, which are formed above the via contacts (M0-V1) 13 and are in contact with part thereof, are further included.

Alternatively, the central ones of the multiple bit lines $BL_{j-2}$, $BL_{j-1}$, $BL_j$, $BL_{j+1}$, $BL_{j+2}$, $BL_{j+3}$, $BL_{j+4}$, . . . are shorter than the other lines which are successively longer along the row length, providing a stepladder-shape pattern.

As shown in FIG. 33, the semiconductor memory, according to the third embodiment of the present invention, includes a stepladder-shaped non-uniform pattern at the ends of bit line patterns $BL_{j-2}$, $BL_{j-1}$, $BL_j$, $BL_{j+1}$, $BL_{j+2}$, $BL_{j+3}$, $BL_{j+4}$, . . . formed on the semiconductor chip 100, and also the via contacts (M0-V1) 13, and the via contacts (V1-M1) 10 for the via contacts (M0-V1) 13.

In other words, as shown in FIG. 33, the semiconductor memory, according to the third embodiment of the present invention, includes: the multiple bit line patterns $BL_{j-2}$, $BL_{j-1}$, $BL_j$, $BL_{j+1}$, $BL_{j+2}$, $BL_{j+3}$, $BL_{j+4}$, . . . , which extend along the column length on the memory cell array and are non-uniformly arranged; the multiple word line patterns (not shown in the drawing), which are orthogonal to the bit line patterns and extend along the row length; and via contacts (M0-V1) 13, which are formed near the ends of the bit line patterns on the memory cell array and are in contact with part of an interconnect extended from the end of the memory cell array. The via contacts (M0-V1) 13 are not in contact with interconnects adjacent to that interconnect.

Figure 40:
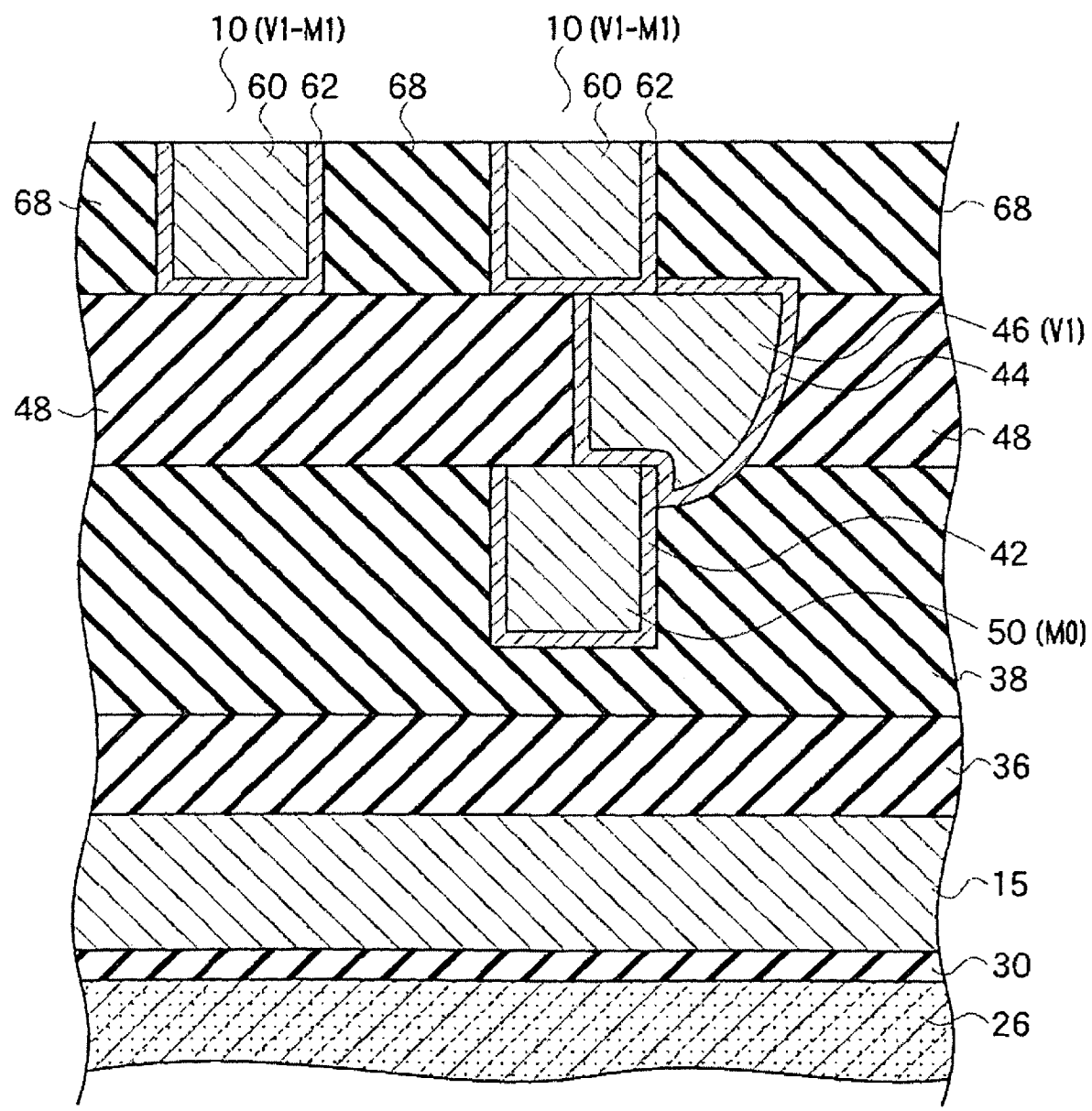
FIG. 40 is a schematic cross-sectional device structure in the nearby region of via contacts (V1-M1)

In addition, as shown in FIG. 40, via contacts (V1-M1) 10, which are in contact with respective parts of the via contacts (M0-V1) 13, are further included.

According to the semiconductor memory of the third embodiment of the present invention, as shown in FIGS. 36 through 39, the via contacts (V1-M1) 10 are formed above the via contacts (M0-V1) 13.

(Method of Forming Ends of Bit Line Patterns)

Figure 34:
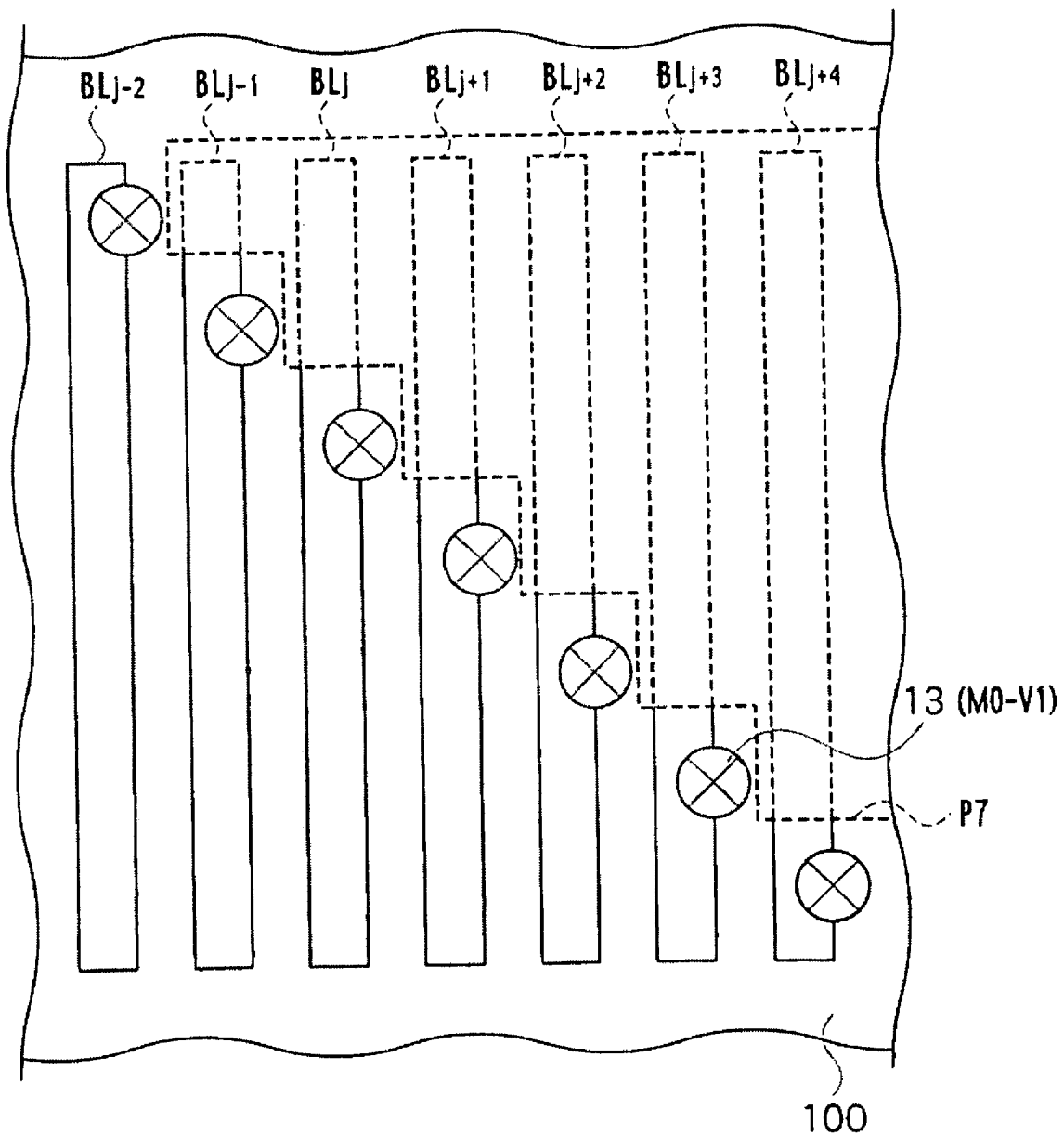
FIG. 34 is a plan view of a pattern for describing a step of a fabrication method for the semiconductor memory according to the third embodiment of the present invention.

As schematically shown in FIG. 34, once bit line patterns $BL_{j-2}$, $BL_{j-1}$, $BL_j$, $BL_{j+1}$, $BL_{j+2}$, $BL_{j+3}$, $BL_{j+4}$, . . . are formed on the semiconductor chip 100, a pattern P7 is formed.

Figure 35:
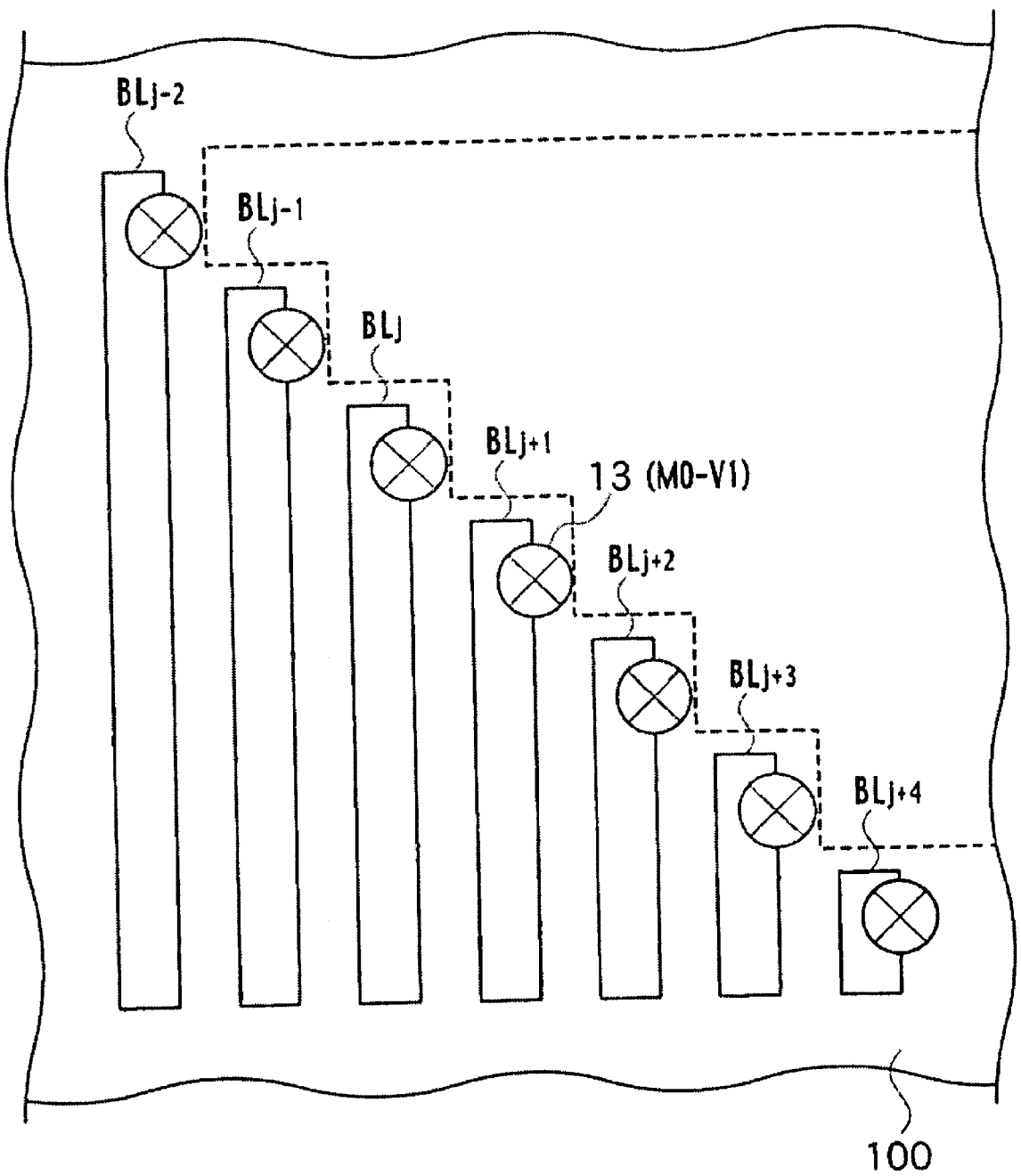
FIG. 35 is a plan view of a pattern for describing a step of the fabrication method for the semiconductor memory according to the third embodiment of the present invention.

As schematically shown in FIG. 35, end portions corresponding to the pattern P7 are removed through double exposure, and the via contacts (M0-V1) 13 are formed in a stepladder-shape.

(Fabrication Method)

The semiconductor memory, according to the third embodiment of the present invention, can be formed with the schematic cross-sectional device structure cut along the line I-I in FIG. 33 through the following fabrication process.

Figure 36:
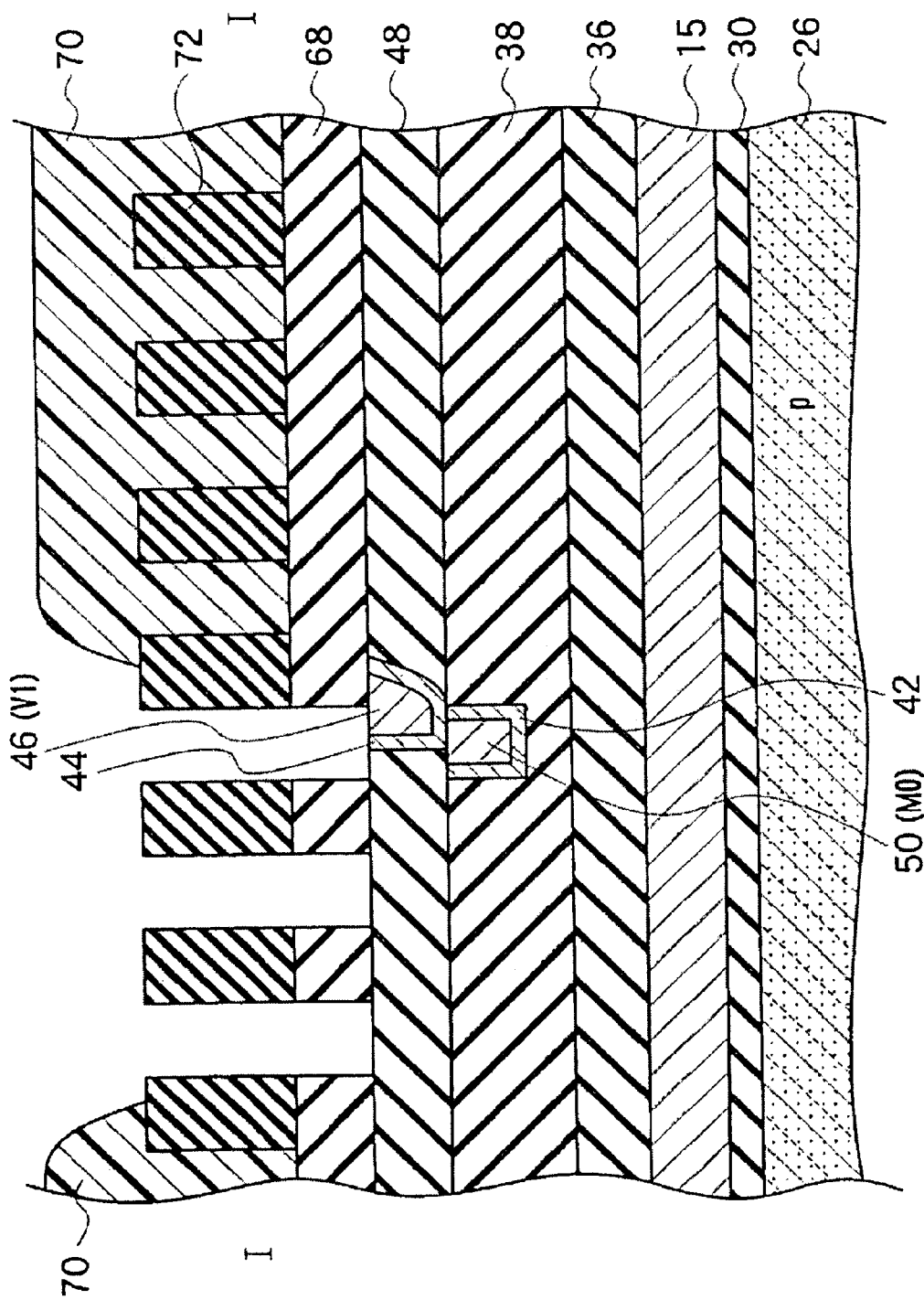
FIG. 36 is a schematic cross-sectional device structure cut along the line I-I in FIG. 33 for describing a step of the fabrication method for the semiconductor memory according to the third embodiment of the present invention.

As shown in FIG. 36, once a via contact (V1) 46 is formed, an interlayer insulating film 68 is deposited thereupon, a pattern for forming metallic interconnects corresponding to the bit lines $BL_{j-2}$, $BL_{j-1}$, $BL_j$, $BL_{j+1}$, $BL_{j+2}$, $BL_{j+3}$, $BL_{j+4}$, . . . is formed on the interlayer insulating film 68 using a mask 72, a resist 70 is coated and a resist 70 pattern is formed through lithography and patterning. The interlayer insulating film 68 at the bit line patterns $BL_{j-2}$, $BL_{j-1}$, $BL_j$ in FIG. 33 is etched and removed until the surface of the via contact (V1) 46 is exposed.

Figure 37:
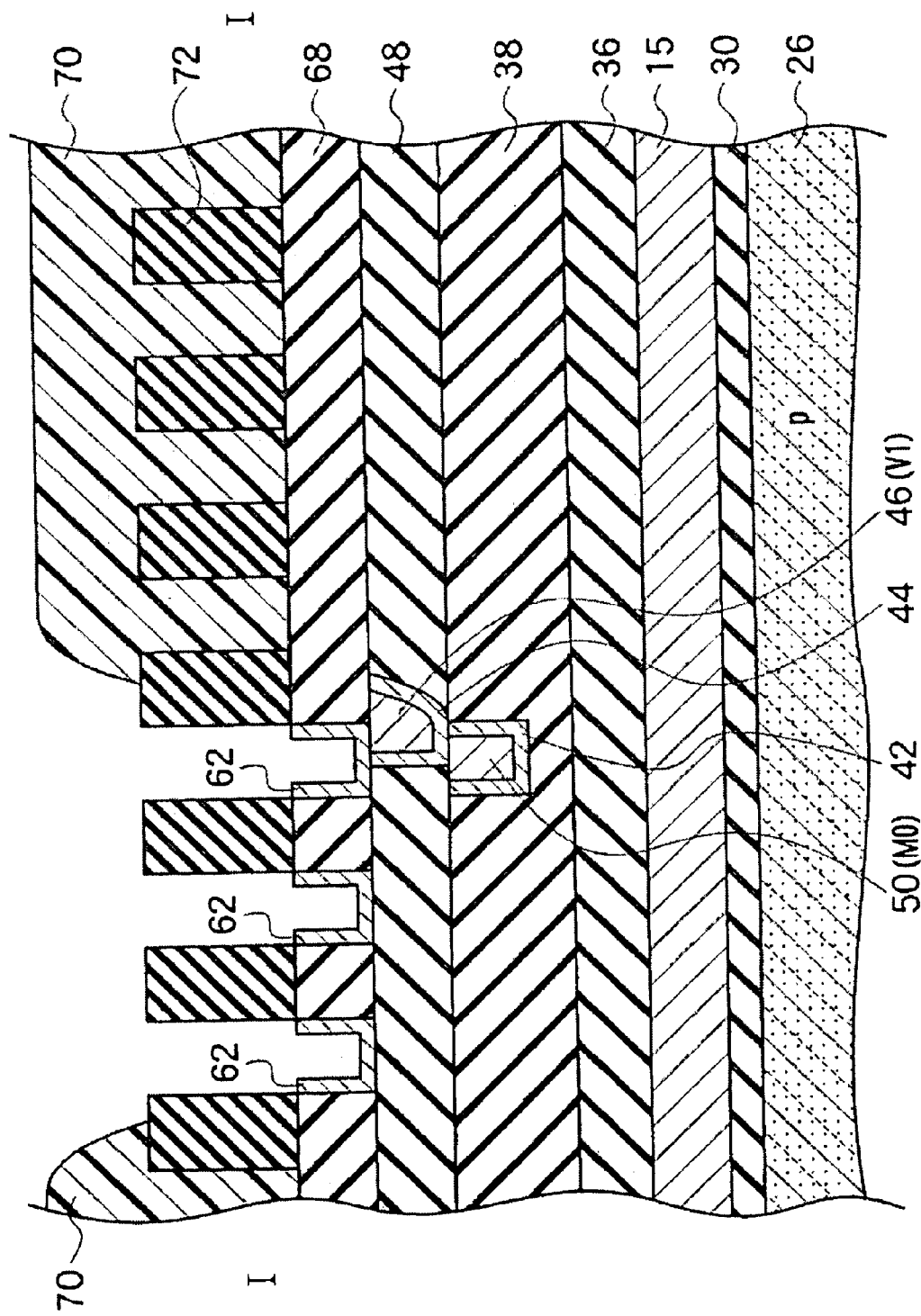
FIG. 37 is a schematic cross-sectional device structure cut along the line I-I in FIG. 33 for describing a step of the fabrication method for the semiconductor memory according to the third embodiment of the present invention.

As shown in FIG. 37, barrier metals 62 are formed on the inner sides of trenches, which are provided through etching. The barrier metal 62 in a trench bottom on which a via contact (V1) 46 is exposed is made to contact the via contact (V1) 46.

Figure 38:
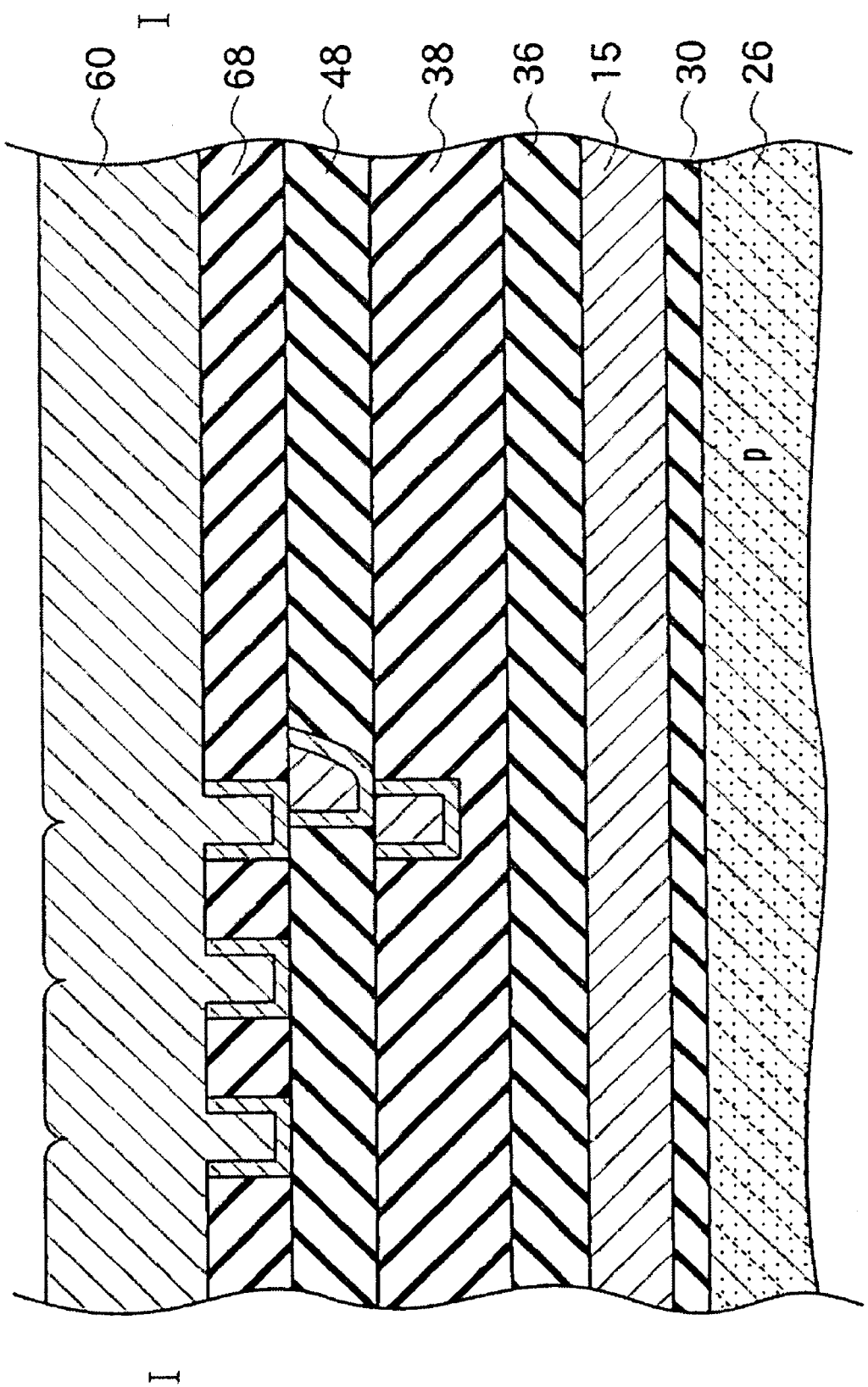
FIG. 38 is a schematic cross-sectional device structure cut along the line I-I in FIG. 33 for describing a step of the fabrication method for the semiconductor memory according to the third embodiment of the present invention.

As shown in FIG. 38, both the mask 72 and the resist 70 are removed, and a thick copper (Cu) electrode film 60 is formed over the entire surface.

Figure 39:
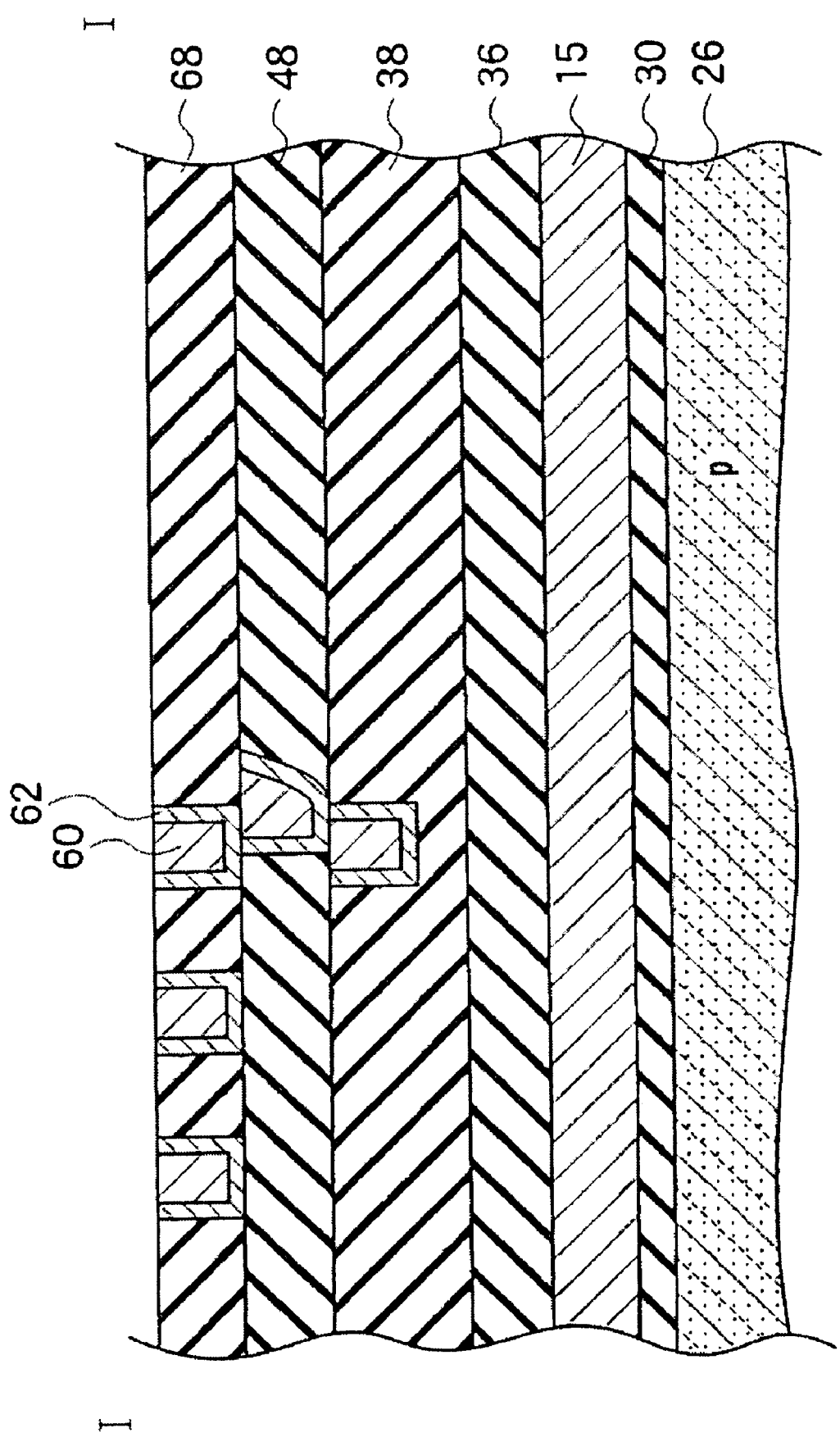
FIG. 39 is a schematic cross-sectional device structure cut along the line I-I in FIG. 33 for describing a step of the fabrication method for the semiconductor memory according to the third embodiment of the present invention.

Afterwards, as shown in FIG. 39, the copper (Cu) electrode film 60 is planarized and removed through etching or chemical mechanical polishing (CMP) until the interlayer insulating film 68 is exposed.

According to the above-described fabrication process, the via contacts (V1-M1) 10 can be finally formed as shown in the magnified diagram of FIG. 40.

According to the semiconductor memory of the third embodiment of the present invention, use of a non-uniform pattern even at the ends of bit line patterns $BL_{j-2}$, $BL_{j-1}$, $BL_j$, $BL_{j+1}$, $BL_{j+2}$, $BL_{j+3}$, $BL_{j+4}$, . . . allows formation of the via contacts (M0-V1) 13 in a stepladder-shape and the via contacts (V1-M1) 10, which are used for connection to the bit line interconnect patterns.

Fourth Embodiment

Figure 41:
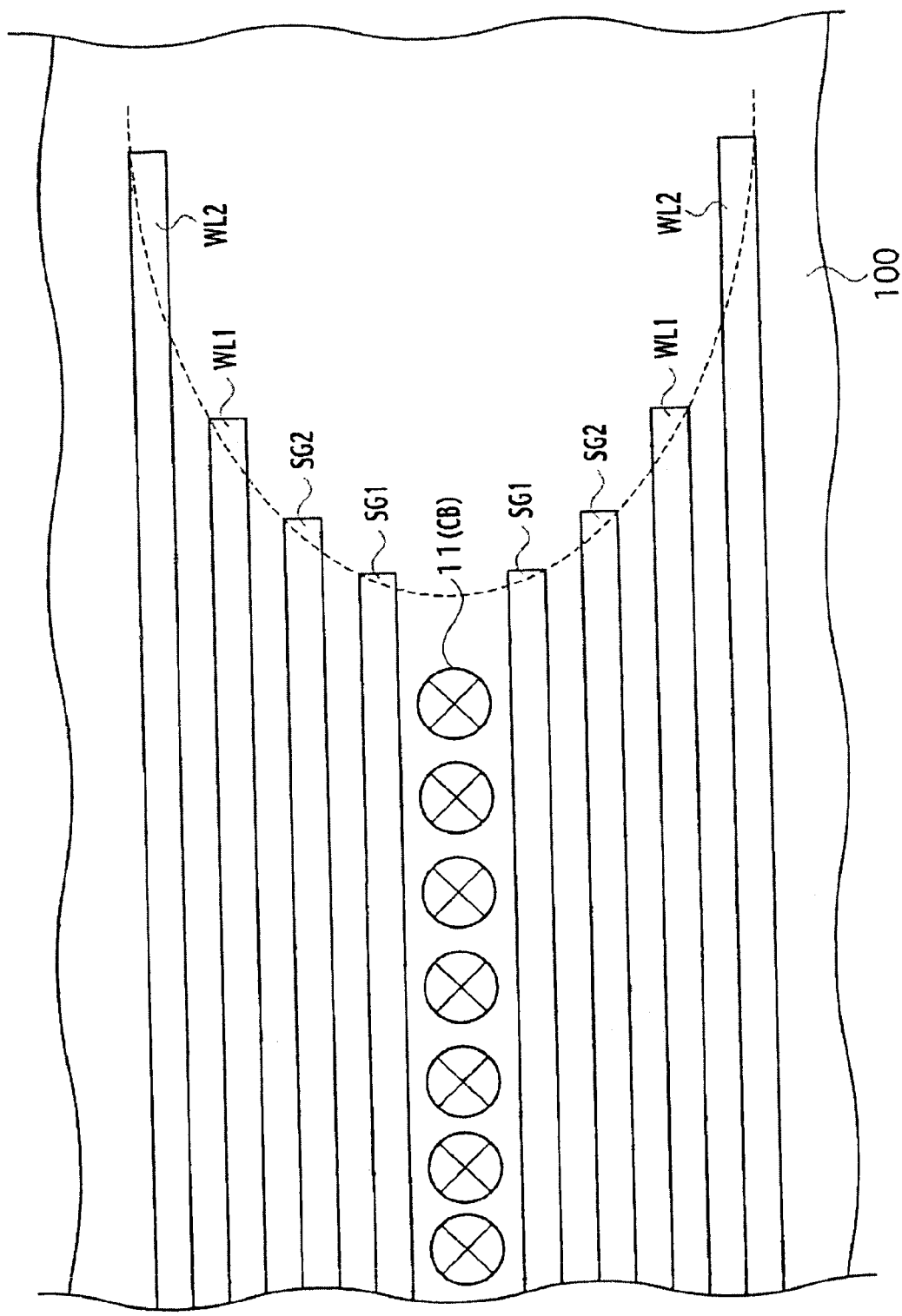
FIG. 41 is a plan view of a schematic pattern at the ends of word lines in a semiconductor memory according to a fourth embodiment of the present invention.

According to a semiconductor memory of the fourth embodiment of the present invention, as shown in FIG. 41, multiple word lines WL1, WL2, . . . are arranged so that the central lines are shorter and the other word lines are successively longer along the column length, providing a parabolic shape.

As shown in FIG. 41, the semiconductor memory, according to the fourth embodiment of the present invention, includes a parabolic-shaped non-uniform pattern, which is provided by removing the ends of the word lines WL1, WL2, . . . through double exposure. There is an advantage in that use of a parabolic pattern eliminates the need for formation of a stepladder-shaped fine pattern.

The structure and the fabrication method for the semiconductor memory, according to the fourth embodiment of the present invention, are the same as those of the first embodiment, thus description thereof is omitted.

According to the semiconductor memory of the fourth embodiment of the present invention as well as the semiconductor memory of the second embodiment of the present invention, it is clear that use of a non-uniform pattern even for the bit line extended regions (M0) 19 allows arrangement and formation of the via contacts (M0-V1) 13 at a pitch twice that of the minimum line and space.

In addition, according to the semiconductor memory of the fourth embodiment of the present invention as well as the semiconductor memory of the third embodiment of the present invention, use of a non-uniform pattern even at the ends of bit line patterns $BL_{j-2}$, $BL_{j-1}$, $BL_j$, $BL_{j+1}$, $BL_{j+2}$, $BL_{j+3}$, $BL_{j+4}$, allows formation of the via contacts (M0-V1) 13 in a stepladder-shape and the via contacts (V1-M1) 10, which are used for connection to the bit line interconnect patterns.

According to the semiconductor memory of the fourth embodiment of the present invention, use of a non-uniform pattern, which is provided by removing the ends of the word lines WL or the control gate lines and the select gate lines SG through double exposure, allows formation and arrangement of the borderless contacts 14, the bit line contacts (CB) 11, and the source line contacts (CS) 12 with a satisfactory pattern margin.

Fifth Embodiment

Figure 42:
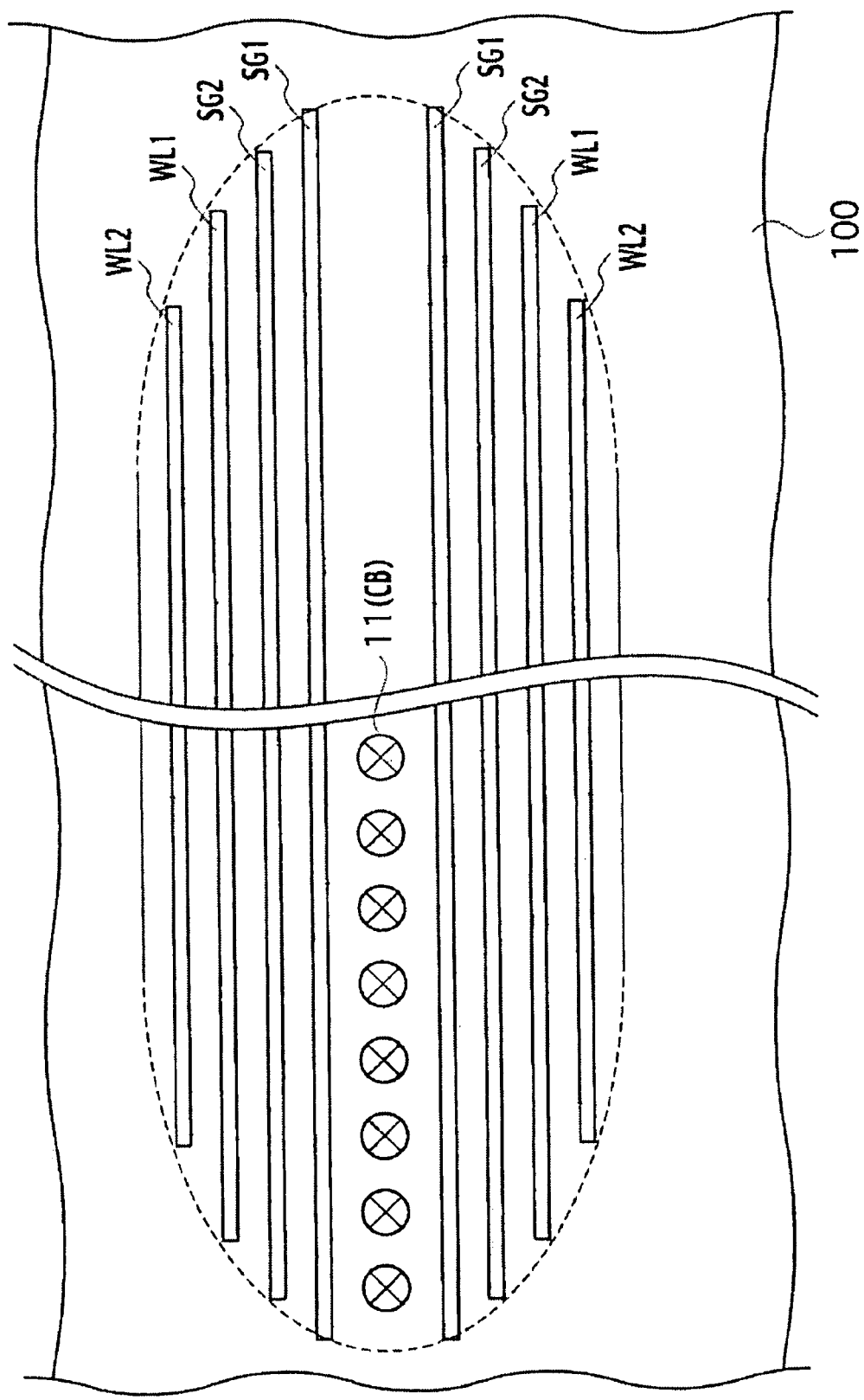
FIG. 42 is a plan view of a schematic pattern at the ends of word lines ends in a semiconductor memory according to a fifth embodiment of the present invention.

According to a semiconductor memory of the fifth embodiment of the present invention, as shown in FIG. 42, multiple word lines WL1, WL2, . . . are arranged so that the central word lines are long and the other word lines are successively shorter than the central word lines along the column length, providing an elliptical shape.

As shown in FIG. 42, the semiconductor memory according to the fifth embodiment of the present invention includes a non-uniform pattern, which is provided by removing the ends of the word lines WL1, WL2, . . . through double exposure. There is an advantage in that use of an elliptical pattern eliminates the need for formation of a stepladder-shaped fine pattern.

The structure and the fabrication method for the semiconductor memory, according to the fifth embodiment of the present invention, are the same as those of the first embodiment, thus description thereof is omitted.

According to the semiconductor memory of the fifth embodiment of the present invention as well as the semiconductor memory of the second embodiment of the present invention, it is clear that use of an elliptical-shaped non-uniform pattern even for the bit line extended regions (M0) 19 allows arrangement and formation of the via contacts (M0-V1) 13 at a pitch twice that of the minimum line and space width.

In addition, according to the semiconductor memory of the fifth embodiment of the present invention as well as the semiconductor memory of the third embodiment of the present invention, use of a non-uniform pattern even at the ends of bit line patterns $BL_{j-2}$, $BL_{j-1}$, $BL_j$, $BL_{j+1}$, $BL_{j+2}$, $BL_{j+3}$, $BL_{j+4}$, . . . allows formation of the via contacts (M0-V1) 13 in a stepladder-shape and the via contacts (V1-M1) 10, which are used for connection to the bit line interconnect patterns.

As described above, according to the semiconductor memory and the fabrication method for the fifth embodiment of the present invention, use of a non-uniform pattern, which is provided by removing the ends of the word lines WL or the control gate lines and the select gate lines SG through double exposure, allows formation and arrangement of the borderless contacts 14, the bit line contacts (CB) 11, and the source line contacts (CS) 12 with a satisfactory pattern margin.

Sixth Embodiment

Figure 43:
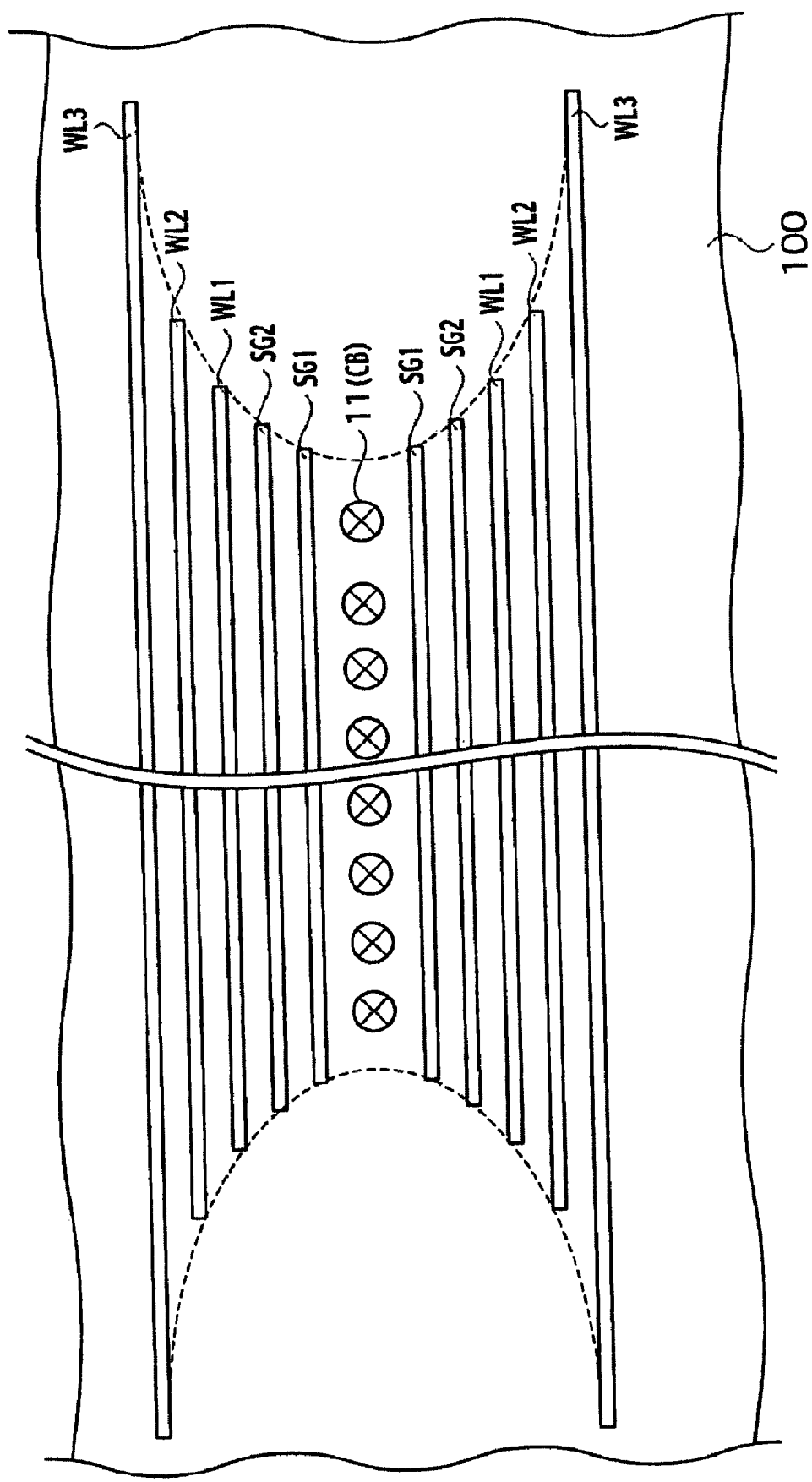
FIG. 43 is a plan view of a schematic pattern at the ends of word lines in a semiconductor memory according to a sixth embodiment of the present invention.

According to a semiconductor memory of the sixth embodiment of the present invention, as shown in FIG. 43, multiple word lines WL1, WL2, . . . are arranged so that the central word lines are shorter and other word lines are successively longer than the central word lines along the column length, providing a parabolic shape.

As shown in FIG. 43, the semiconductor memory, according to the sixth embodiment of the present invention, includes a parabolic-shaped non-uniform pattern, which is provided by removing both ends of the word lines WL1, WL2, . . . through double exposure. There is an advantage in that use of a parabolic pattern eliminates the need for formation of a stepladder-shaped fine pattern.

The structure and the fabrication method of the semiconductor memory according to the sixth embodiment of the present invention are the same as those of the first embodiment, thus description thereof is omitted.

According to the semiconductor memory of the sixth embodiment of the present invention as well as the semiconductor memory of the second embodiment of the present invention, it is clear that use of a non-uniform pattern even for the bit line extended regions (M0) 19 allows arrangement and formation of the via contacts (M0-V1) 13 at a pitch twice that of the minimum line and space width.

In addition, according to the semiconductor memory of the sixth embodiment of the present invention as well as the semiconductor memory of the third embodiment of the present invention, use of a non-uniform pattern even at the ends of bit line patterns $BL_{j-2}$, $BL_{j-1}$, $BL_j$, $BL_{j+1}$, $BL_{j+2}$, $BL_{j+3}$, $BL_{j+4}$, . . . allows formation of the via contacts (M0-V1) 13 in a stepladder-shape and the via contacts (V1-M1) 10, which are used for connection to the bit line interconnect patterns.

As described above, according to the semiconductor memory of the sixth embodiment of the present invention, use of a non-uniform pattern, which is provided by removing the ends of the word lines WL or the control gate lines and the select gate lines SG through double exposure, allows formation and arrangement of the borderless contacts 14, the bit line contacts (CB) 11, and the source line contacts (CS) 12 with a satisfactory pattern margin.

Seventh Embodiment

NAND Type

Figure 44:
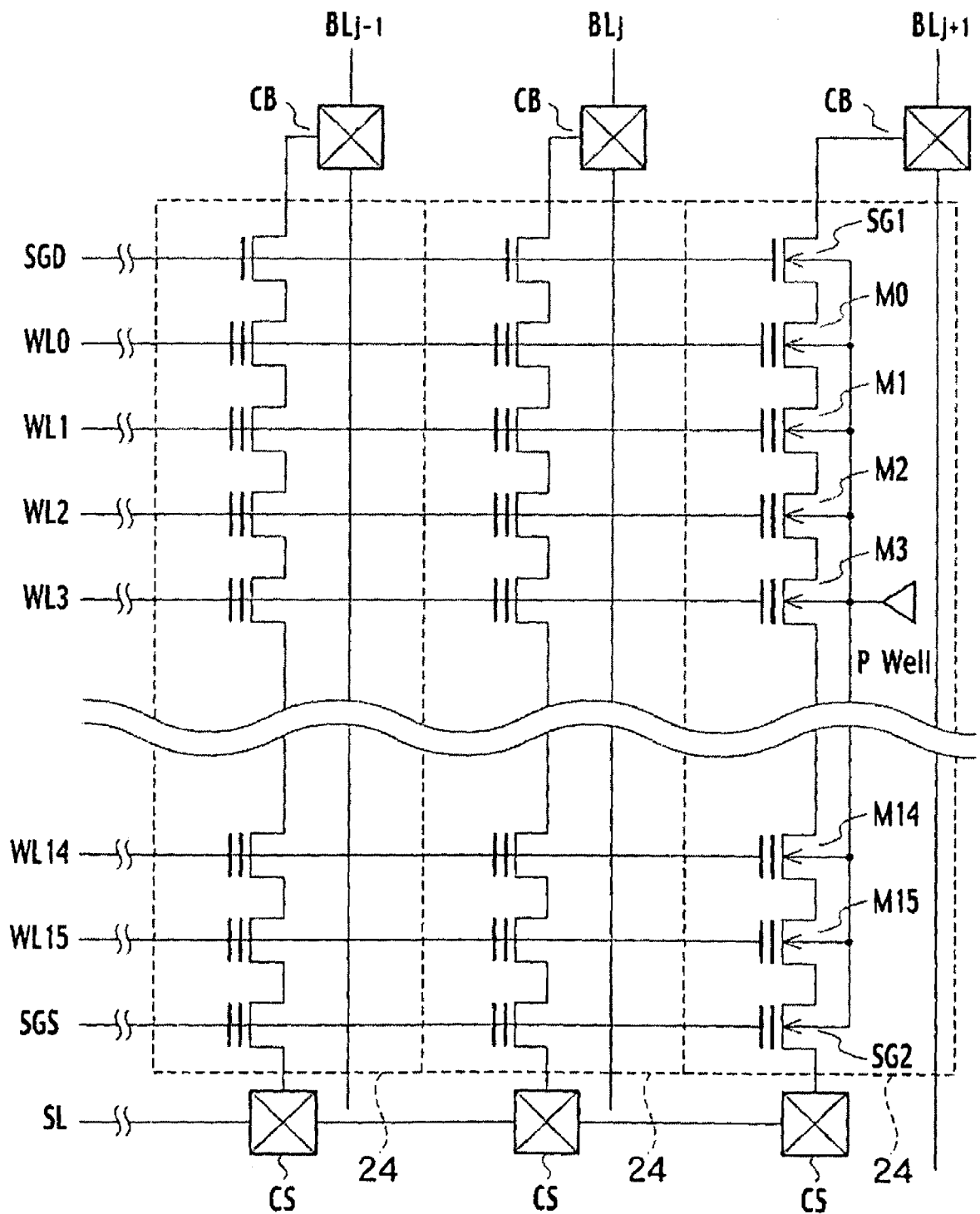
FIG. 44 is a plan view of a schematic pattern at the ends of word lines in a semiconductor memory according to a seventh embodiment of the present invention.

As shown in FIG. 44, a semiconductor memory according to the seventh embodiment of the present invention has a NAND-type circuit structure.

NAND cell units 24 are configured from memory cell transistors M0 through M15 and select gate transistors SG1 and SG2, as shown in detail in FIG. 44. The drains of select gate transistors SG1 are connected to respective bit lines $BL_{j-1}$, $BL_j$, $BL_{j+1}$, . . . via respective bit line contacts CB, and the sources of select gate transistors SG2 are connected to a common source line SL via source line contacts CS.

An exemplary semiconductor memory, according to the seventh embodiment of the present invention, has a NAND flash EEPROM structure as a basic structure, including a gate insulating film 30 as a tunnel insulating film, which is formed on a p-well or a semiconductor substrate 26, and memory cells, each having a stacked gate structure configured from a floating gate 8, an inter-gate insulating film 7, and a control gate 2 on the gate insulating film 30. Multiple memory cells are connected in series along the bit line length via source and drain diffusion layers of each memory cell transistor, select gate electrodes 15 of the select gate transistors are arranged at both ends thereof, and bit line contacts (CB) 11 and source line contacts (CS) 12 are connected via those select gate transistors. As a result, a memory cell unit is configured, and a plurality of such memory cell units is arranged in parallel along the word line WL length orthogonal to the bit lines.

As described above, according to the semiconductor memory of the seventh embodiment of the present invention, it is clear that use of a non-uniform pattern, which is provided by removing the ends of the word lines WL or the control gate lines and the select gate lines SG through double exposure, allows formation and arrangement of the borderless contacts 14, the bit line contacts (CB) 11, and the source line contacts (CS) 12 with a satisfactory pattern margin.

In addition, according to the semiconductor memory of the seventh embodiment of the present invention as well as the semiconductor memory of the second embodiment of the present invention, it is also clear that use of a non-uniform pattern even for the bit line extended regions (M0) 19 allows arrangement and formation of the via contacts (M0-V1) 13 at a pitch twice that of the minimum line and space width.

Furthermore, according to the semiconductor memory of the seventh embodiment of the present invention as well as the semiconductor memory of the third embodiment of the present invention, it is clear that use of a non-uniform pattern even for the ends of bit line patterns $BL_{j-2}$, $BL_{j-1}$, $BL_j$, $BL_{j+1}$, $BL_{j+2}$, $BL_{j+3}$, $BL_{j+4}$, ... allows formation of the via contacts (M0-V1) 13 in a stepladder-shape and the via contacts (V1-M1) 10, which are used for connection to the bit line interconnect patterns.

Eighth Embodiment

AND Type

Figure 45:
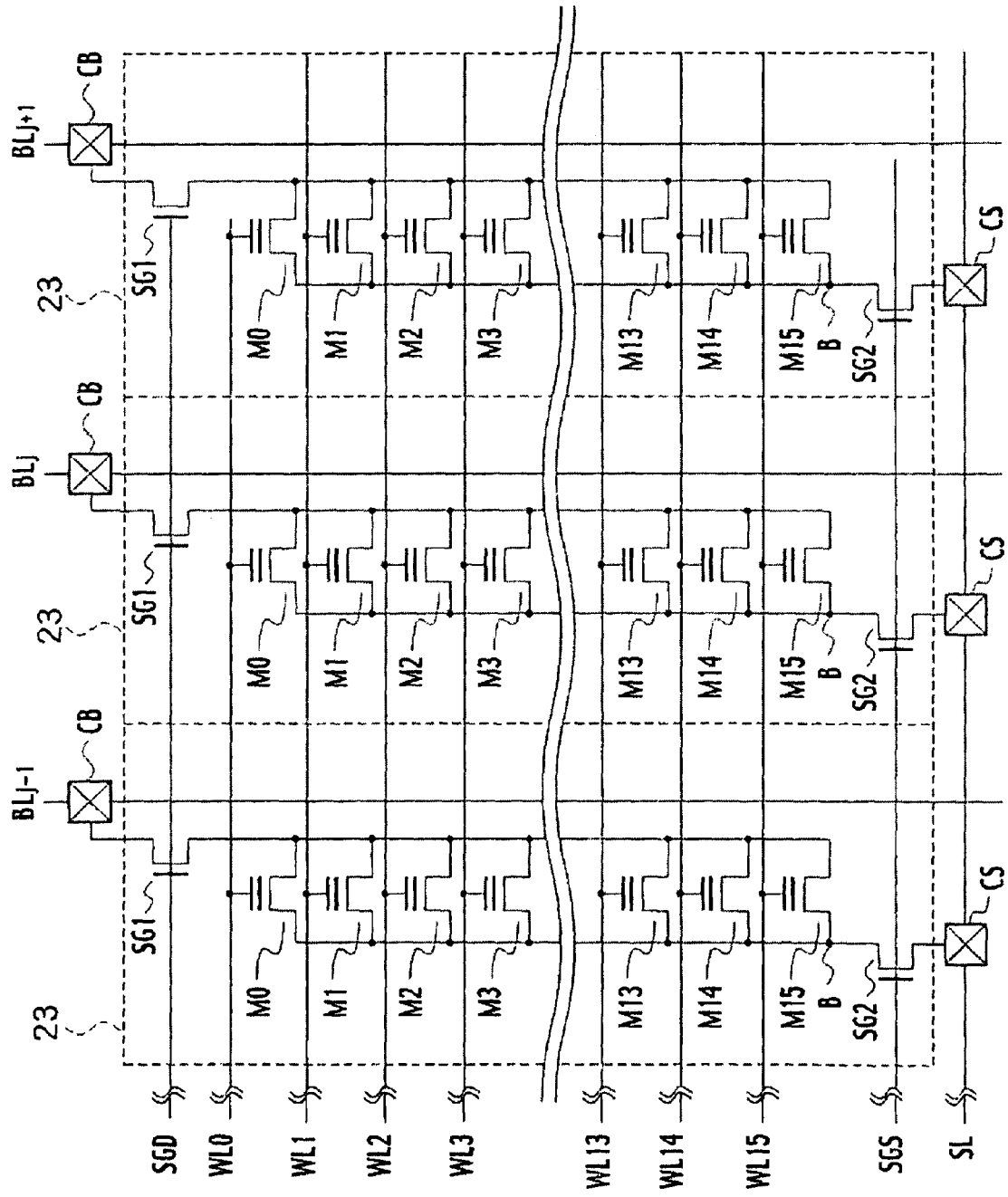
FIG. 45 is a plan view of a schematic pattern at the ends of word lines in a semiconductor memory according to an eighth embodiment of the present invention.

As shown in FIG. 45, a semiconductor memory, according to the eighth embodiment of the present invention, has an AND-type circuit structure.

AND cell units 23 are configured from memory cell transistors M0 through M15, which are connected in parallel, and select gate transistors SG1 and SG2, as shown in detail in FIG. 45. The drains of the select gate transistors SG1 are connected to the respective bit lines $BL_{j-1}$, $BL_j$, $BL_{j+1}$, ... via the respective bit line contacts CB, and the sources of the select gate transistors SG2 are connected to the common source line SL via the respective source line contacts CS.

In FIG. 45, reference numeral 23 denotes AND cell units, which are enclosed with a dashed line. Each of the drain regions of the memory cell transistors M0 through M15 is commonly connected, and each of the source regions thereof is also commonly connected within the AND cell units 23. In other words, as shown in FIG. 45, the memory cell transistors M0 through M15 in the AND cell units 23 of AND flash memory are connected in parallel, and on one side thereof bit line side select transistors SG1 are connected. On the other side of the AND flash memory, source line side select transistors SG2 are connected. Word lines WL0 through WL15 are connected to the corresponding gates of the respective memory cell transistors M0 through M15. A select gate line SGD is connected to the gates of the respective bit line side select transistors SG1. A select gate line SGS is connected to the gates of the respective source line side select transistors SG2. The drains of the bit line side select transistors SGS1 are connected to the bit lines $BL_{j-1}$, $BL_j$, $BL_{j+1}$, ... via the respective bit line contacts CB. The sources of the source line side select transistors SG2 are connected to the source line SL via the respective source line contacts CS.

As described above, according to the semiconductor memory of the eighth embodiment of the present invention as well as the first embodiment, it is clear that use of a non-uniform pattern, which is provided by removing the ends of the word lines WL or the control gate lines and the select gate lines SG through double exposure, allows formation and arrangement of the borderless contacts 14, the bit line contacts (CB) 11, and the source line contacts (CS) 12 with a sufficient pattern margin.

In addition, according to the semiconductor memory of the eighth embodiment of the present invention as well as the semiconductor memory of the second embodiment of the present invention, it is also clear that use of a non-uniform pattern even for the bit line extended regions (M0) 19 allows arrangement and formation of the via contacts (M0-V1) 13 at a pitch twice that of the minimum line and space width.

Furthermore, according to the semiconductor memory of the eighth embodiment of the present invention as well as the semiconductor memory of the third embodiment of the present invention, it is clear that use of a non-uniform pattern even at the ends of bit line patterns $BL_{j-2}$, $BL_{j-1}$, $BL_j$, $BL_{j+1}$, $BL_{j+2}$, $BL_{j+3}$, $BL_{j+4}$, ... allows formation of the via contacts (M0-V1) 13 in a stepladder-shape and the via contacts (V1-M1) 10, which are used for connection to the bit line interconnect patterns.

Ninth Embodiment

NOR Structure

Figure 46:
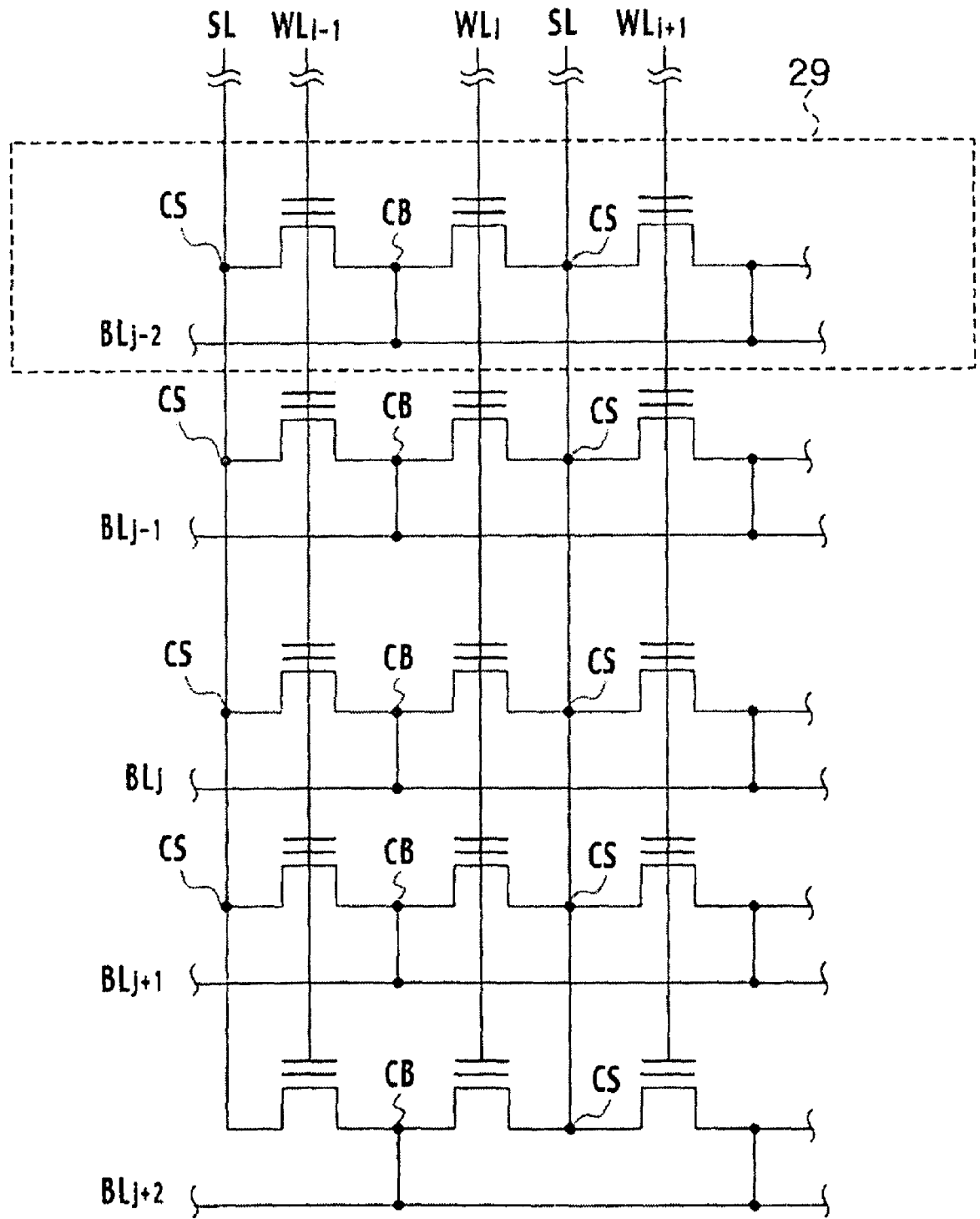
FIG. 46 is a plan view of a schematic pattern at the ends of word lines in a semiconductor memory according to a ninth embodiment of the present invention.

As shown in FIG. 46, a semiconductor memory, according to the ninth embodiment of the present invention, has a NOR-type circuit structure.

In FIG. 46, reference numeral 29 denotes a NOR cell unit, which is enclosed with a dashed line. In the NOR cell unit 29, the common source region of two adjacent memory cell transistors is connected to a source line SL via a source line contact, and the common drain region thereof is connected to bit lines $BL_{j-2}$, $BL_{j-1}$, $BL_j$, $BL_{j+1}$, $BL_{j+2}$ via a bit line contact CB. In addition, NOR cell units 29 are arranged along the lengths of word lines $WL_{i-1}$, $WLi_j$, $WLi_{j+1}$ ... orthogonal to the bit lines $BL_{j-2}$, $BL_{j-1}$, $BL_j$, $BL_{j+1}$, $BL_{j+2}$ ... and each of word lines $WL_{i-1}$, $WLi_j$, $WLi_{j+1}$ ... commonly connects the gates of the memory cell transistors among NOR cell units. The nonvolatile semiconductor memory with a NOR-type circuit structure is characterized in that it can read out at a higher speed than the NAND-type structure.

As described above, according to the semiconductor memory of the ninth embodiment of the present invention as well as the first embodiment, it is clear that use of a non-uniform pattern, which is provided by removing the ends of the word lines WL or the control gate lines and the select gate lines SG through double exposure, allows formation and arrangement of the borderless contacts 14, the bit line contacts (CB) 11, and the source line contacts (CS) 12 with a satisfactory pattern margin.

In addition, according to the semiconductor memory of the ninth embodiment of the present invention as well as the semiconductor memory of the second embodiment of the present invention, it is also clear that use of a non-uniform pattern even for the bit line extended regions (M0) 19 allows arrangement and formation of the via contacts (M0-V1) 13 at a pitch twice that of the minimum line and space width.

Furthermore, according to the semiconductor memory of the ninth embodiment of the present invention as well as the semiconductor memory of the third embodiment of the present invention, it is clear that use of a non-uniform pattern even at the ends of bit line patterns $BL_{j-2}$, $BL_{j-1}$, $BL_j$, $BL_{j+1}$, $BL_{j+2}$, $BL_{j+3}$, $BL_{j+4}$, ... allows formation of the via contacts (M0-V1) 13 in a stepladder-shape and the via contacts (V1-M1) 10, which are used for connection to the bit line interconnect patterns.

Tenth Embodiment

Figure 47:
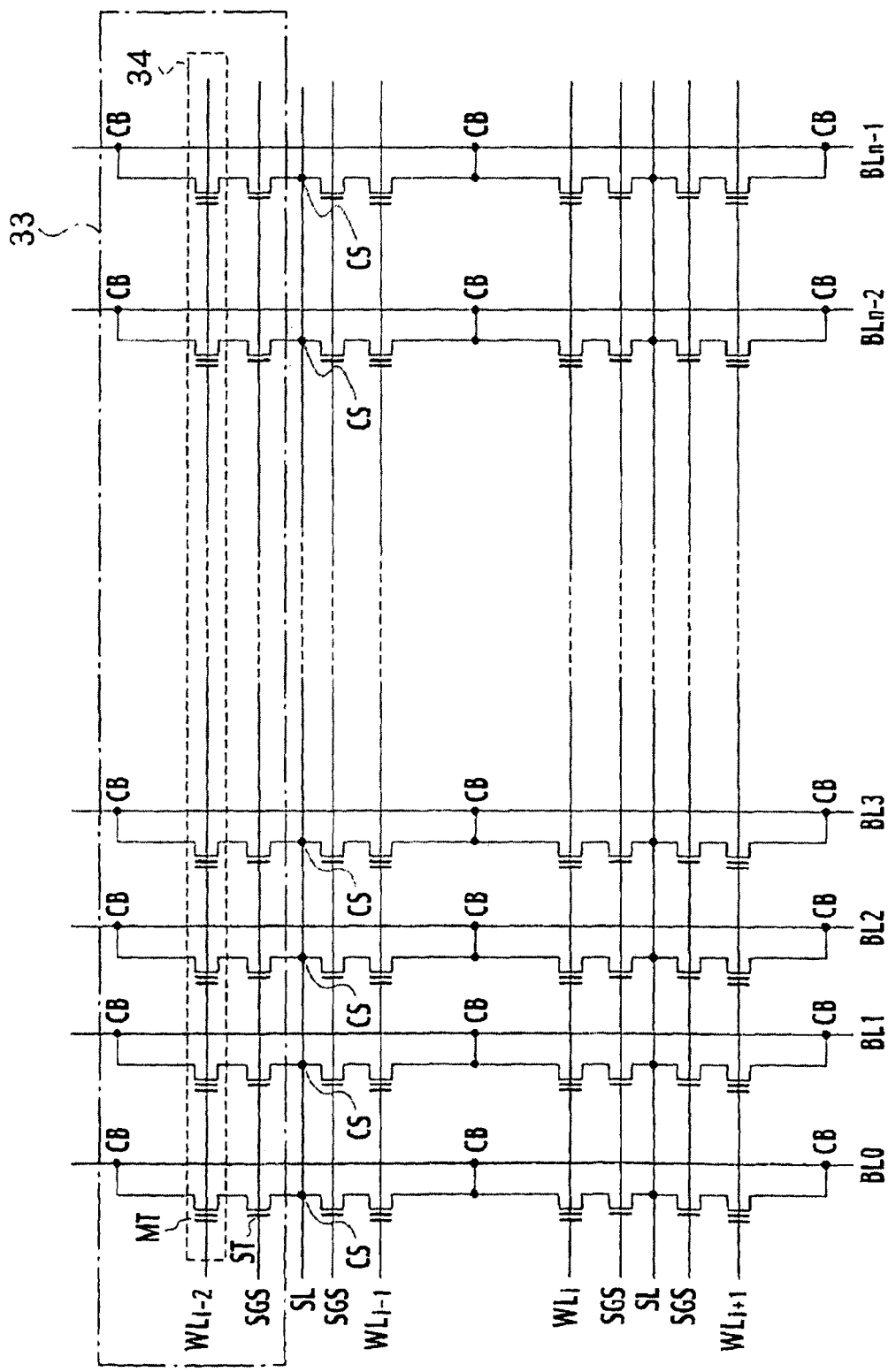
FIG. 47 is a plan view of a schematic pattern at the ends of word lines in a semiconductor memory according to a tenth embodiment of the present invention.

As shown in FIG. 47, a semiconductor memory according to the tenth embodiment of the present invention has a two-transistor/cell circuit structure.

An exemplary semiconductor memory, according to the tenth embodiment of the present invention, has a two-transistor/cell system structure as a basic structure, including a gate insulating film 30 as a tunnel insulating film, which is formed on a p-well or a semiconductor substrate 26, and memory cells, each having a stacked gate structure configured from a floating gate 8, an inter-gate insulating film 7, and a control gate 2 on the gate insulating film 30. The drain region of a memory transistor MT is connected to a bit line contact (CB) 11 via the diffusion layer 18, and the source region thereof is connected to the drain region of a select transistor ST via the diffusion layer 18. In addition, the source region of the select transistor ST is connected to a source line contact (CS) 12 via the diffusion layer 18. Such two-transistor/cell memory cells, which are arranged in parallel along the word line length, as shown in FIG. 47, configure a memory cell block 33. Within a single memory cell block 33, the word line $WL_{i-2}$ is commonly connected to the control gates of memory cells, thereby configuring a page unit 34. Naturally, pages within multiple blocks may configure a page unit. In addition, the select gate line SGS is commonly connected to the gates of respective select transistors. On the other hand, along the length of bit lines BL0, BL1, BL2, ..., BLn, circuit structures having two-transistor/cell system memory cells symmetrically arranged with the source line SL as a line of symmetry are arranged in series.

As a result, as shown in FIG. 47, the bit line contacts CB are linearly arranged along the word line length between the word lines $WL_{i-1}$ and $WL_i$, and the source line contacts CS are linearly arranged along the word line length between the adjacent select gate lines SGS.

As described above, according to the semiconductor memory of the tenth embodiment of the present invention as well as the first embodiment, it is clear that use of a non-uniform pattern, which is provided by removing the ends of the word lines WL or the control gate lines and the select gate lines SG through double exposure allows formation and arrangement of the borderless contacts 14, the bit line contacts (CB) 11, and the source line contacts (CS) 12 with a satisfactory pattern margin.

In addition, according to the semiconductor memory of the tenth embodiment of the present invention as well as the semiconductor memory of the second embodiment of the present invention, it is also clear that use of a non-uniform pattern even for the bit line extended regions (M0) 19 allows arrangement and formation of the via contacts (M0-V1) 13 at a pitch twice that of the minimum line and space width.

Furthermore, according to the semiconductor memory of the tenth embodiment of the present invention as well as the semiconductor memory of the third embodiment of the present invention, it is clear that use of a non-uniform pattern even at the ends of bit line patterns $BL_{j-2}$, $BL_{j-1}$, $BL_j$, $BL_{j+1}$, $BL_{j+2}$, $BL_{j+3}$, $BL_{j+4}$, ... allows formation of the via contacts (M0-V1) 13 in a stepladder-shape and the via contacts (V1-M1) 10, which are used for connection to the bit line interconnect patterns.

Eleventh Embodiment

Figure 48:
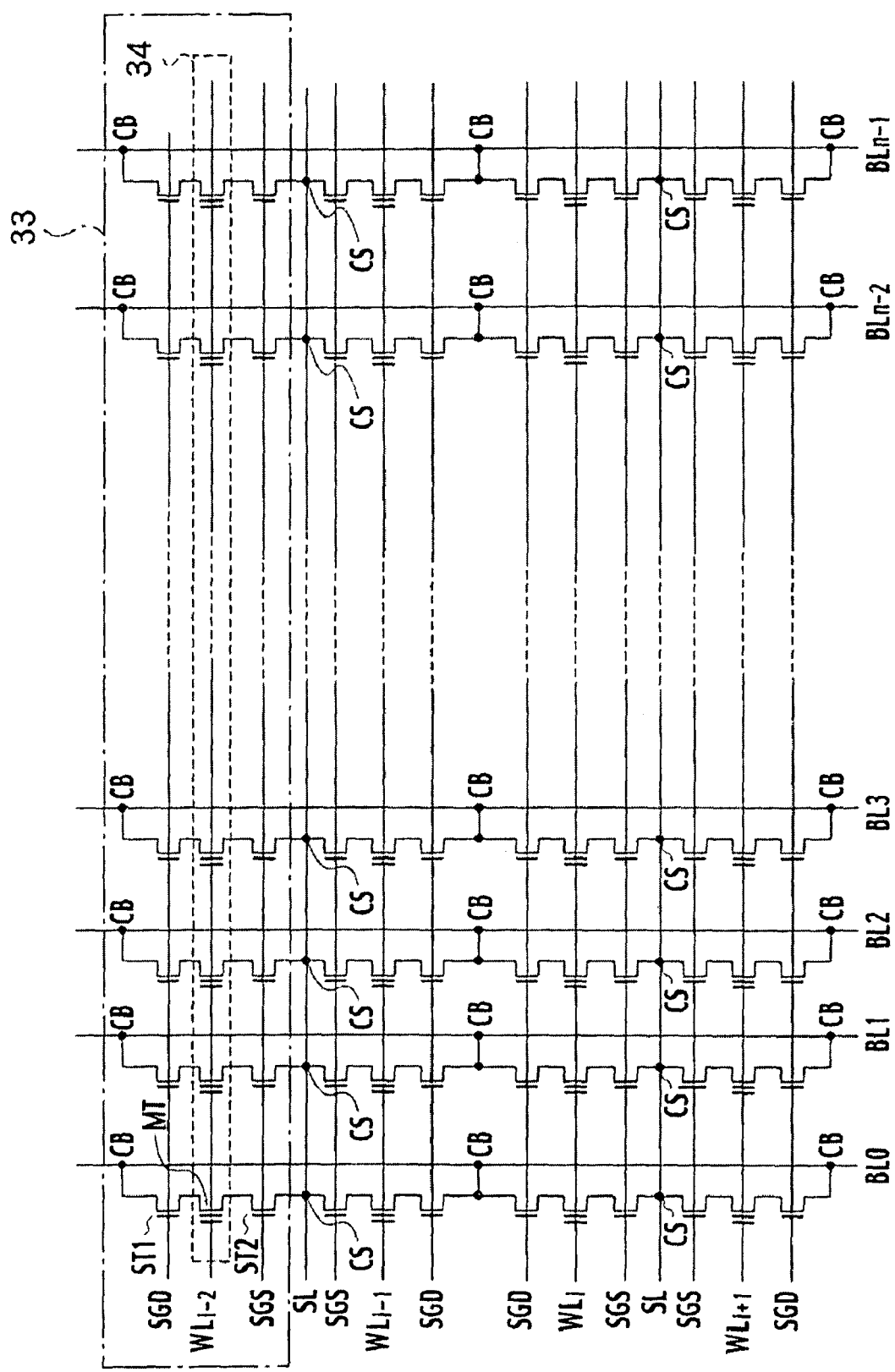
FIG. 48 is a plan view of a schematic pattern at the ends of word lines in a semiconductor memory according to an eleventh embodiment of the present invention.

As shown in FIG. 48, a semiconductor memory, according to the eleventh embodiment of the present invention, has a three-transistor/cell circuit structure.

The exemplary semiconductor memory, according to the eleventh embodiment of the present invention, has a three-transistor/cell structure as a basic structure, including a gate insulating film 30 as a tunnel insulating film, which is formed on a p-well or a semiconductor substrate 26, and memory cells, each having a stacked gate structure configured from a floating gate 8, an inter-gate insulating film 7, and a control gate 2 on the gate insulating film 30. The drain region of a memory cell transistor MT is connected to a bit line contact (CB) 11 via a bit line side select transistor ST1, and the source region thereof is connected to a source line contact (CS) 12 via the source line side select transistor ST2. Such three-transistor/cell memory cells, which are arranged in parallel along the word line length, as shown in FIG. 48, configure a memory cell block 33. Within a single memory cell block 33, the word line $WL_{i-2}$ is commonly connected to the control gates 2 of memory cells, thereby configuring a page unit 34. Naturally, pages within multiple blocks may configure a page unit. In addition, a select gate line SGS is commonly connected to the gates of the source line side select transistors ST2, and the select gate line SGD is commonly connected to the gates of the bit line side select transistors ST1. On the other hand, along the length of bit lines BL0, BL1, BL2, ..., BLn, circuit structures having three-transistor/cell memory cells symmetrically arranged with source line SL as a line of symmetry are arranged in series.

As a result, as shown in FIG. 48, the bit line contacts CB are linearly formed along the word line length between the word lines $WL_{i_1}$ and $WL_i$, and the source line contacts CS are linearly formed along the word line length between the adjacent select gate lines SGS.

The semiconductor memory, according to the eleventh embodiment of the present invention, is capable of carrying out an operation intermediary to the NAND type and the NOR type. Even in such three-transistor/cell system circuit structure, as shown in FIG. 48, the bit line contacts (CB) 11 and the source line contacts (CS) 12 are linearly arranged.

As described above, according to the semiconductor memory of the eleventh embodiment of the present invention as well as the first embodiment, it is clear that use of a non-uniform pattern, which is provided by removing the ends of the word lines WL or the control gate lines and the select gate lines SG through double exposure, allows formation and arrangement of the borderless contacts 14, the bit line contacts (CB) 11, and the source line contacts (CS) 12 with a satisfactory pattern margin.

In addition, according to the semiconductor memory of the eleventh embodiment of the present invention as well as the semiconductor memory of the second embodiment of the present invention, it is also clear that use of a non-uniform pattern even for the bit line extended regions (M0) 19 allows arrangement and formation of the via contacts (M0-V1) 13 at a pitch twice that of the minimum line and space width.

Furthermore, according to the semiconductor memory of the eleventh embodiment of the present invention as well as the semiconductor memory of the third embodiment of the present invention, it is clear that use of a non-uniform pattern even at the ends of bit line patterns $BL_{j-2}$, $BL_{j-1}$, $BL_j$, $BL_{j+1}$, $BL_{j+2}$, $BL_{j+3}$, $BL_{j+4}$, ... allows formation of the via contacts (M0-V1) 13 in a stepladder-shape and the via contacts (V1-M1) 10, which are used for connection to the bit line interconnect patterns.

OTHER EMBODIMENTS

As described above, the present invention is described according to the first through the eleventh embodiment; however, it should not be perceived that descriptions forming part of this disclosure and the drawings are intended to limit the spirit and scope of the present invention. Various alternative embodiments, working examples, and operational techniques will become apparent from this disclosure for those skilled in the art.

For example, the first through the eleventh embodiment of the present invention mainly describes two-valued NAND EEPROM. However, the present invention is applicable to multi-valued cell NAND EEPROM of three values or more. For example, four-valued NAND EEPROM allows a memory capacity twice that of the two-valued NAND EEPROM. In addition, the present invention is applicable to multi-valued cell NAND EEPROM of m values (m>3) or more.

In this manner, the present invention naturally includes various embodiments not described herein. Accordingly, the technical scope of the present invention is determined only by specified features of the invention according to appended claims that can be regarded appropriate from the above-mentioned descriptions.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A semiconductor memory comprising:
   a plurality of bit lines that extend on a memory cell array along the column length of the memory cell array;
   a plurality of word lines that extend along the row length of the memory cell array; and
   a plurality of via contacts formed at respective ends of the bit lines,
   wherein, the bit lines are linearly formed, and the lengths of at least two adjacent bit lines along the column length differ from each other; and
   the plurality of bit lines is arranged so that central lines of the plurality of bit lines are shorter than other lines of the plurality of bit lines and the other lines of the plurality of bit lines are successively longer along the column length, so as to be in a stepladder-shape.

* * * * *